United States Patent [19]
Ichikawa et al.

[11] Patent Number: 6,149,320
[45] Date of Patent: Nov. 21, 2000

[54] PHOTOSENSITIVE MATERIAL PROCESSING APPARATUS AND SEALING STRUCTURE FOR PROCESSING SECTION OF THE APPARATUS

[75] Inventors: Kazuo Ichikawa; Shinichi Miyamoto; Kenichi Miyamoto; Tomoyuki Takiue; Yutaka Takeo, all of Kanagawa; Susumu Yoshida; Hisao Kanzaki, both of Shizuoka-ken, all of Japan

[73] Assignee: Fuji Photo Film Co., Ltd., Kanagawa, Japan

[21] Appl. No.: 09/274,352

[22] Filed: Mar. 23, 1999

[30] Foreign Application Priority Data

Mar. 30, 1998 [JP] Japan .................................. 10-083263

[51] Int. Cl.[7] .................................................. G03D 13/00
[52] U.S. Cl. .......................................... 396/564; 396/620
[58] Field of Search .................................... 396/599, 626, 396/636, 641, 564

[56] References Cited

U.S. PATENT DOCUMENTS 4,179,208 12/1979 Martino .................................. 396/614

FOREIGN PATENT DOCUMENTS

| 0 050 818 | 5/1982 | European Pat. Off. .......... G03F 7/26 |
| 43 07 923 | 9/1993 | Germany .......................... G03F 7/30 |
| 6-295071 | 10/1994 | Japan . | |

*Primary Examiner*—D. Rutledge
*Attorney, Agent, or Firm*—Sughrue, Mion, Zinn, Macpeak & Seas, PLLC

[57] ABSTRACT

A box-shaped shielding cover is disposed at the surface of a developing solution contained in a developing tank and the bottom wall of the cover ensures that contact between the developing solution and the air is kept to a minimum and that deterioration of the processing solution due to carbon dioxide and evaporation of the water are controlled. Moreover, the close contact between the top portion of the peripheral wall of the shielding cover and the top cover covering the top portion of the PS plate processor cuts off the flow of air over the developing tank (the air flowing from the insertion aperture to the discharge aperture). Accordingly, the airtightness of the seal in the developing section is enhanced, there is minimal deterioration of the developing solution due to carbon dioxide, and the rate of replenishment of the developing solution is reduced.

23 Claims, 35 Drawing Sheets

PHOTOSENSITIVE MATERIAL PROCESSING APPARATUS AND SEALING STRUCTURE FOR PROCESSING SECTION OF THE APPARATUS

BACKGROUND OF THE INVENTION

1. Field of the Invention

The present invention relates to a photosensitive material processing apparatus for processing a photosensitive material and to a sealing structure of a processing section of the photosensitive material processing apparatus.

2. Description of the Related Art

A photosensitive material, for example, a lithographic presensitized printing plate (hereinafter referred to as a PS plate), undergoes developing processing by means of a lithographic presensitized printing plate processing apparatus (hereinafter referred to as a PS plate processor). In this PS plate processor, a PS plate having an image recorded thereon is immersed in developing solution contained in a developing tank while being transported through the developing tank, and non-image portions of the photosensitive layer of the PS plate are removed by a rubbing means such as a brush roller in the developing solution. A PS plate, which has completed this type of developing processing, is washed with washing water in the washing section (washing processing) and then undergoes a type of plate surface protection processing where the plate is coated with a gum solution in the desensitizing section (desensitizing processing).

Japanese Patent Application Laid-Open No. 6-295071 discloses a lithographic printing plate processing apparatus which includes a pair of transporting rollers provided in the vicinity of an inlet opening of the apparatus, and a pair of transporting rollers provided at an upstream side of an exit opening of a finishing section of the apparatus. A pair of blades which are mounted on the periphery of the exit opening contact the pair of transporting rollers provided in the vicinity of an inlet opening of the apparatus, and a pair of transporting rollers provided at an upstream side of an exit opening of a finishing section of the apparatus. The apparatus further includes a shutter for closing the exit opening when the apparatus is not operated. Accordingly, the introduction of ambient air into the apparatus is prevented and the evaporation of processing solution is decreased In order to minimize the contact between carbon dioxide in the atmosphere and the developing solution, a plate-shaped floating cover is floated on the surface of the developing solution contained in the developing tank.

However, the air flowing from the PS plate processor insertion aperture to its discharge aperture cannot be cut off from the surface of the solution simply by floating a plate-shaped cover on the surface of the solution. Therefore, the surface of the developing solution, which is not covered by the floating cover, contacts with fresh carbon dioxide from the in-flow of air above the floating cover and deterioration of the developing solution is accelerated by the carbon dioxide gas. Moreover, because of evaporation of the water in the developing solution, the rate of replenishment of the developing solution increases.

In a conventional PS plate processor, a driving section, consisting of gears and the like for driving a brush roller and the like, is provided above the surface of the developing solution inside the developing tank, making the provision of a cut-off means for halting the flow of air above the solution more difficult. This has meant that further minimizing of the deterioration of the developing solution caused by carbon dioxide in the atmosphere has not been achievable.

SUMMARY OF THE INVENTION

In consideration of the above, it is an object of the present invention to reduce the deterioration of a processing or developing solution caused by carbon dioxide by cutting off the flow of air in the processing section, and to reduce the amount of replenishing solution to be replenished to a processing solution by reducing the evaporation of the water contained in the processing solution.

In the present invention, the photosensitive material is processed by being immersed in processing solution contained in a processing or developing tank while being transported by a transporting means through the processing solution. A shielding cover is provided in this processing tank to minimize as much as possible the amount of contact between the processing solution and the atmosphere and thereby minimize evaporation of the water in the solution and deterioration of the processing solution by carbon dioxide.

Moreover, the top cover covering the processing tank is in contact with the upper portion of the shielding cover and thereby cuts off the flow of air above the processing solution (the flow of air from the photosensitive material insertion aperture to its discharge aperture. This increases the degree of airtightness of the seal of the processing tank and reduces the deterioration of the processing solution caused by carbon dioxide. Moreover, by minimizing the evaporation of the water in the processing solution, the amount of replenishment of the processing solution can be reduced.

Preferably, in the present invention, an engaging portion is formed in the rear surface of the top cover to engage with the upper portion of the shielding cover. The seal between the top cover and the shielding cover is made more airtight by the engaging portion ensuring that the flow of air above the processing solution is cut off.

Preferably, in the present invention, a transporting system for the transporting means and a driving system for driving the transporting means are separated by a side plate integrally formed with the processing tank. A lid portion that covers the top of the driving system extending from the side plate seals the driving system. Accordingly, because the driving system is not disposed above the transporting system which transports the photosensitive material, as in a conventional system, a shielding cover can be easily provided above the transporting system enabling the flow of air to be cut off. Moreover, the flow of air from the driving system towards the transporting system can be cut off. This allows deterioration of the processing solution due to carbon dioxide to be kept to a minimum.

Preferably, in the present invention, a roller for transporting the photosensitive material is provided at the bottom edge portion of the wall of the shielding cover on the upstream side in the transporting direction of the photosensitive material extending in a direction intersecting the transporting direction of the photosensitive material. This construction allows the photosensitive material to be guided by the roller so that it is not damaged by colliding with the bottom edge portion of the wall of the shielding cover.

Preferably, in the present invention, in order to make the shielding cover as light as possible, it is constructed as a hollow box.

Preferably, in the present invention, the processing solution in the processing tank is replenished with replenishing solution so that the level of the surface of the processing solution in the processing tank is always above the bottom surface of the shielding cover. This ensures that there is no space under the bottom surface of the shielding cover and that, because no air can get into the processing tank, there is minimal deterioration of the processing solution.

Preferably, in the present invention, the central portion of the bottom of the photosensitive material processing tank is shaped with a wide V-shape protruding downwards and the photosensitive material is transported parallel to the bottom surface of the processing tank. The amount of processing solution stored in the processing tank can therefore be reduced and the photosensitive material can be transported smoothly.

The photosensitive material used in the present invention is preferably a lithographic presensitized printing plate. When the photosensitive material processing apparatus having a processing section with a sealed structure of the present invention is used to process a lithographic presensitized printing plate, there is minimal deterioration of the processing solution due to carbon dioxide in the atmosphere and minimal evaporation of the water in the processing solution because of the high degree to which the processing section is sealed. Accordingly stable processing of the lithographic presensitized printing plate is made possible.

BRIEF DESCRIPTION OF THE DRAWINGS

FIG. 26(A) is a front view showing the state when conventional squeezing rollers squeeze a PS plate, while

DESCRIPTION OF THE PREFERRED EMBODIMENTS

Figure 1:
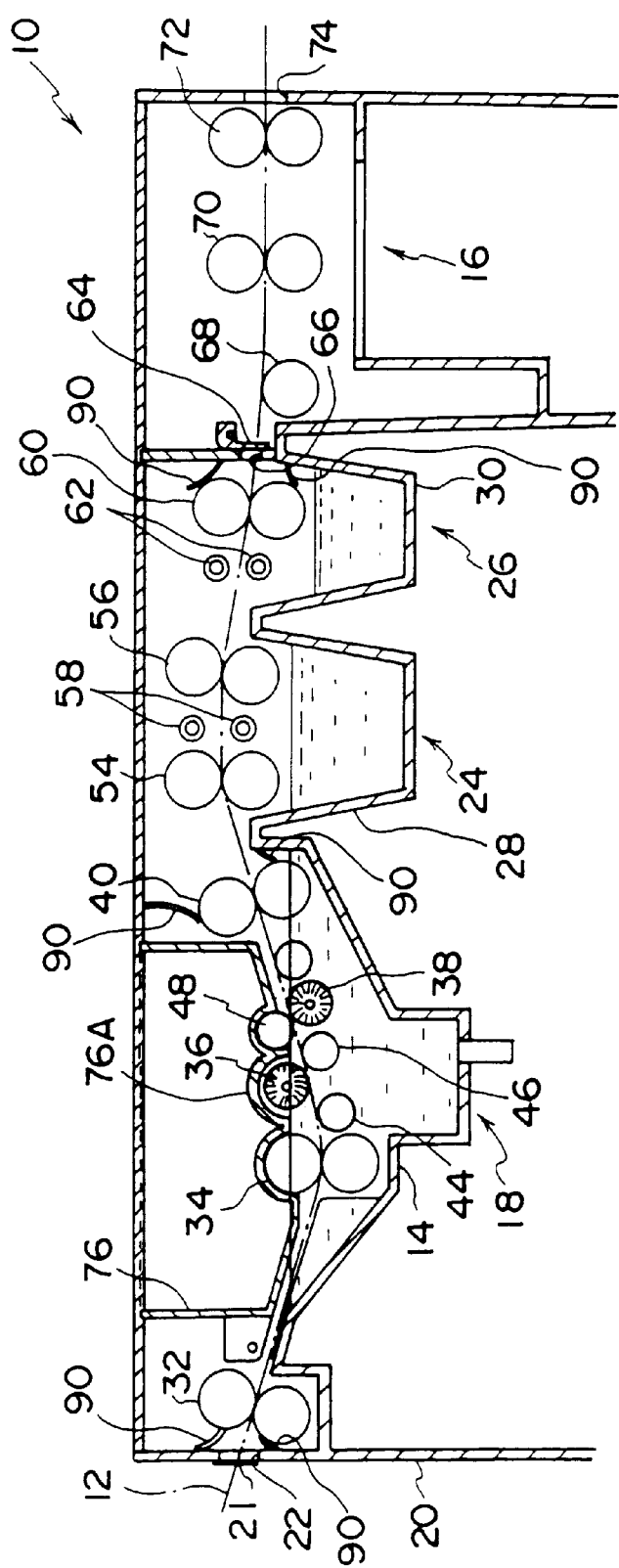
FIG. 1 is a schematic structural view of the PS plate processor of the present embodiment.

A lithographic presensitized printing plate processing apparatus (hereinafter referred to as PS plate processor 10) which is suitable for use in the present embodiment is shown in FIG. 1. A lithographic presensitized printing plate (hereinafter referred to as PS plate 12) having an image printed thereon by means of an unillustrated printing apparatus is develop-processed by the PS plate processor 10.

The PS plate processor will now be briefly described. The PS plate processor 10 is provided with a developing section 18 for developing the PS plate 12, a washing section 24 for washing the developing solution adhered to the PS plate 12, a finisher section 26 for desensitizing the washed PS plate 12 by coating it with a gum solution, and a drying section 16 for drying the PS plate 12. The developing section 18, the washing section 24, and the finisher section 26 are provided respectively with a developing tank 14, a washing tank 28, and a gum solution tank 30.

A slit-shaped insertion aperture 22 for inserting the PS plate 12 is provided in the external plate panel 20 on the developing section 18 side. A pair of transporting rollers 32 is disposed on the inner side of the insertion aperture 22. A PS plate 12, which has been inserted through the insertion aperture 22, is nipped and transported by these transporting rollers 32 and is fed towards the developing tank 14 at a predetermined angle to the horizontal.

The developing tank 14 is formed with a widely opened top portion and with the central portion of the bottom thereof shaped with a wide V-shape protruding downwards. Inside this developing tank 14 are disposed in sequence in the transporting direction of the PS plate 12, a pair of transporting rollers 34, brush rollers 36 and 38, and a pair of squeezing rollers 40. These rollers are rotated by a driving mechanism disposed between the side plate 42 and the external plate panel 20 shown in FIG. 4.

Figure 3:
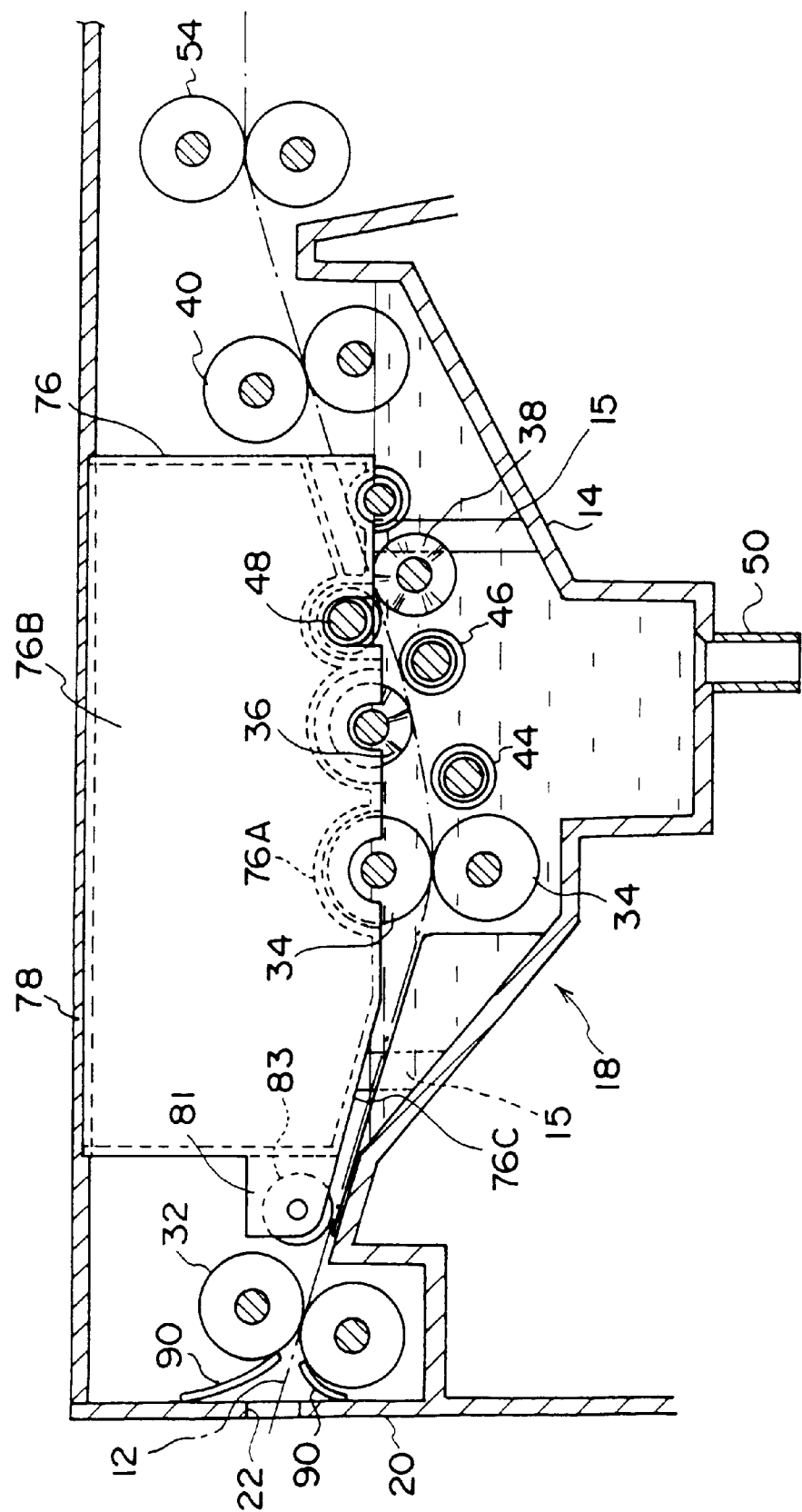
FIG. 3 is a side cross-sectional view of the developing tank of the PS plate processor of the present embodiment.

As is shown in FIG. 3, the brush roller 36 is disposed between backup rollers 44 and 46 which are disposed at the opposite side of the transporting path of the PS plate 12. A backup roller 48 is disposed opposite the brush roller 38. These backup rollers rotate freely having no driving force transmitted thereto.

It should be noted that in the developing section 18, the developing solution in the developing tank 14 is sucked, via a fitting tube 50 provided in the bottom wall of the developing tank, out of the developing tank 14 and is 13, then injected through an inlet opening formed in the side wall back into the developing tank, thereby circulating and stirring the developing solution.

On the other hand, as is shown in FIG. 1, a pair of transporting rollers 54 and 56 are disposed above the washing tank 28 in the washing section 24 downstream from the developing section 18. These transporting rollers 54 and 56 are rotatably supported by the side plates and form the transporting path along which the PS plate 12 is fed from the developing section 18 when a driving force is transmitted by the driving means.

Vertically aligned spray pipes 58 are disposed facing each other on either side of the transporting path of the PS plate between the transporting rollers 54 and 56 with their spray nozzles facing the transporting path. Washing water is pumped up by a pump from an unillustrated washing water tank and is sprayed from the spray pipes 58 onto the front and rear surfaces of the PS plate thereby washing these surfaces. The washing water runs into the washing tank 28 after the PS plate is washed.

A pair of squeezing rollers 60 are provided above the gum solution tank 30 of the finisher section 26 downstream of the washing section 24 where the PS plate is desensitized. The PS plate 12 is fed by the transporting rollers 56 to these squeezing rollers 60.

Vertically aligned spray pipes 62 are disposed facing each other on either side of the transporting path of the PS plate upstream from the squeezing rollers 60 with their spray nozzles facing the transporting path. Gum solution is pumped up by a pump and is sprayed from the spray pipes 62 onto the front and rear surfaces of the PS plate thereby coating these surfaces with gum.

Subsequently, the PS plate 12, which has been uniformly coated with the gum solution by the squeezing rollers 60, passes through a passage aperture 66 in the transporting path, which is opened and closed by a shutter 64, and is guided to the drying section 16. In the drying section 16, the PS plate 12 is dried as it is transported by a guide roller 68 and pairs of skewer rollers 70 and 72 and is discharged to the outside of the PS plate processor 10 through a discharge outlet 74.

The characteristic structures of the developing section 18, the washing section 24, the finisher section 26, and the drying section 16 will be explained below.

(Sealing Structure for Developing Section)

Figure 2:
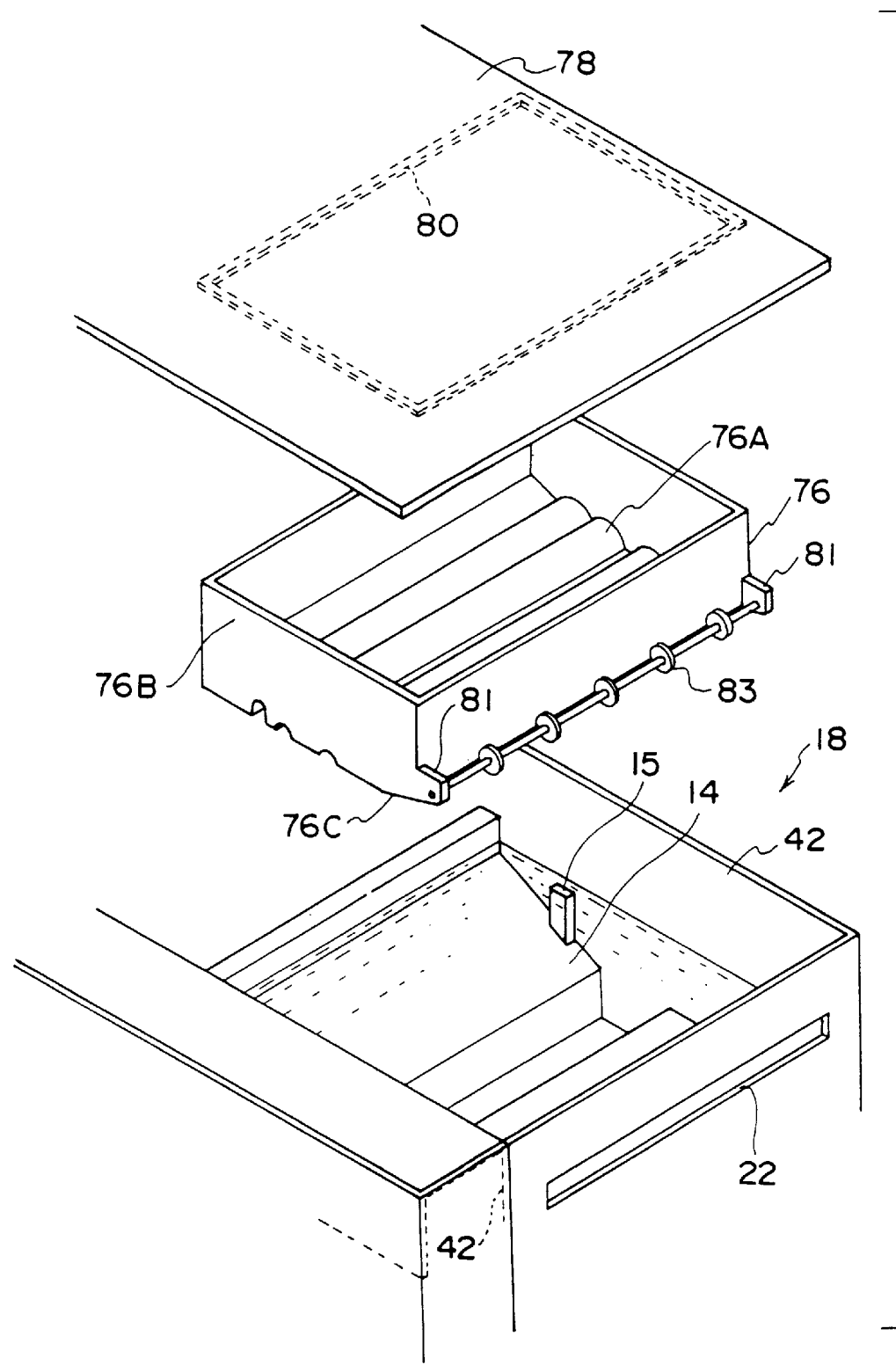
FIG. 2 is an exploded perspective view of the developing tank, shielding cover, and top cover of the PS plate processor of the present embodiment.
Figure 4:
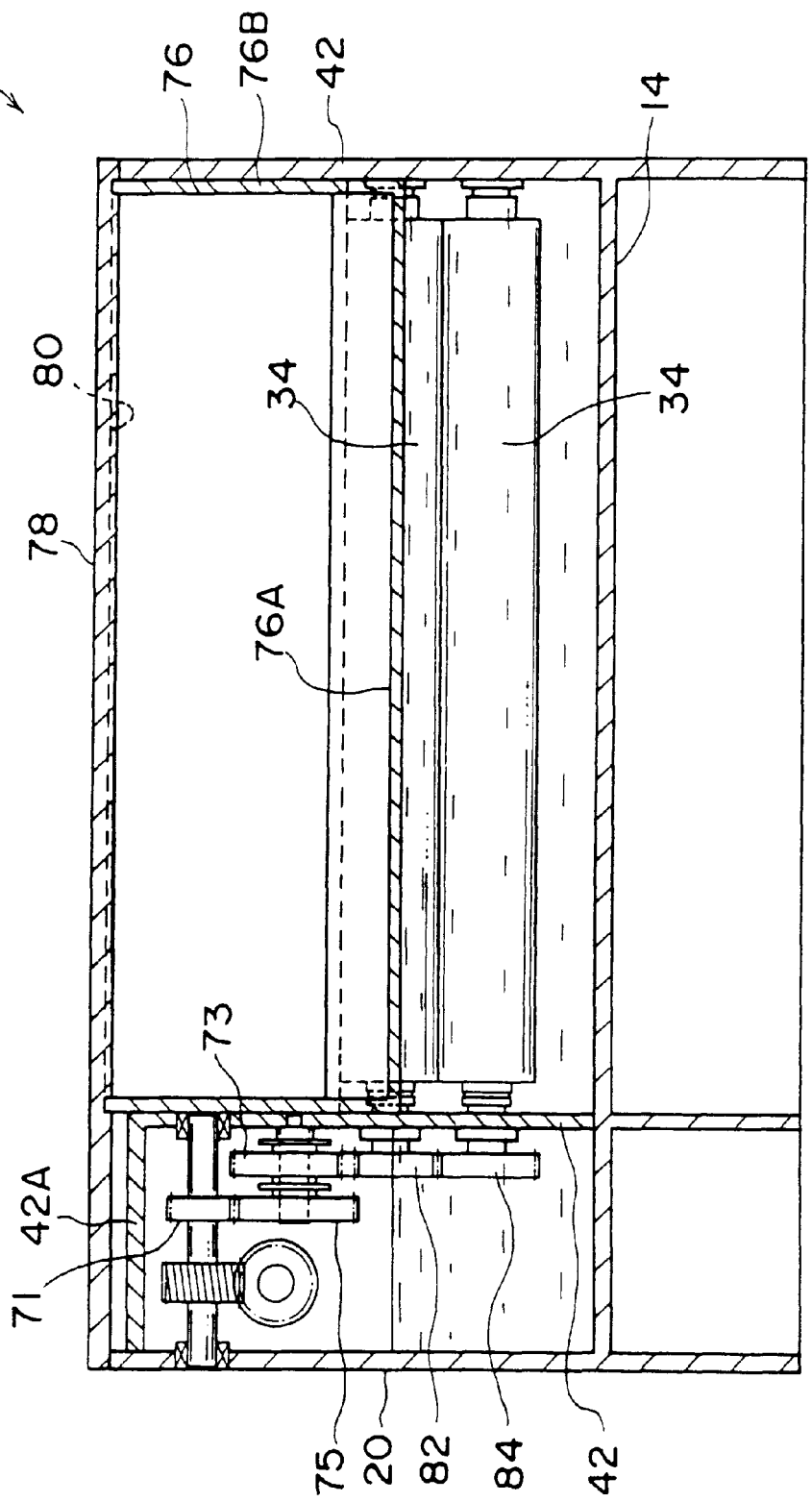
FIG. 4 is a front cross-sectional view of the developing tank of the PS plate processor of the present embodiment.

As is shown in FIGS. 2 to 4, the box-shaped shielding cover 76 is supported by supporting portions 15 provided at four places as integral parts of the tank walls of the developing tank 14. The bottom wall 76A of the shielding cover 76 is formed with a series of arc-shaped curves formed therein so that the bottom wall 76A does not contact with the upper peripheral surfaces of the transporting roller 34, the brush roller 36, and the backup roller 48 thereby not interfering with the rollers and so.

As can be seen in FIG. 4, the widthwise dimensions of the bottom wall 76A are substantially the same as the inner dimensions between the side plates 42 constituting the developing tank 14. This prevents the surface of the solution from being exposed in the gap between the bottom wall 76A and the side plates 42. Moreover, the side walls 76B of the shielding cover 76 extend as far as the top cover 78 covering the top of the PS plate processor.

A rectangular groove 80 is formed in the top cover 78 so that, when the shielding cover 76 is set inside the developing tank 14 and the top cover 78 is placed on top, the top of the side walls 76B engage with the groove 80 thereby completely sealing the top of the developing tank 14. Alternatively, the groove 80 may be formed as a protruding flange for engaging with the top of the side walls 76B.

On the other hand, the upstream edge of the bottom surface 76A of the shielding cover 76 tapers in a direction parallel to the transporting path of the PS plate 12 and brackets 81 extend towards the insertion aperture 22 at the same angle as the taper. A skewer roller 83 is supported by the brackets 81.

In the above-described structure, the flow of air above the developing solution (the flow of air from the insertion aperture 22 to the discharge aperture 74) is completely cut off by the side walls 76B of the shielding cover 76 and the top cover 78. This ensures that the airtightness of the developing section 18 is increased and deterioration of the developing solution by carbon dioxide is reduced because there is no inflow of new carbon dioxide. In addition, evaporation of the water content in the developing solution is minimized thereby reducing the rate of replenishment of the processing solution. Moreover, because the PS plate 12 is guided by the skewer roller 83, there is no damage from the PS plate 12 colliding with the corner of the wall in the upstream direction of the bottom wall 76A.

The shielding cover 76 is formed as a hollow box, as is shown in FIG. 2, therefore, in spite of the fact that the shielding cover 76 is made large enough to fill most of the space in the developing section 18 and cut off the flow of air, it is lightweight and can easily be detached from and replaced in the developing section 18.

The developing solution is replenished with replenishing solution so that the surface of the developing solution is always above the bottom wall 76A of the shielding cover 76. This ensures that there is no gap beneath the bottom wall 76A and that no air can enter therein.

As is shown in FIG. 1, because rubber blades 90 are provided extending from one side plate 42 to the other side plate 42 so as to contact the pair of transporting rollers 32 and the pairs of squeezing rollers 40 and 60, and a shutter 64 is provided in the transporting path aperture 66, the airtightness of the developing section 18 is further increased and deterioration of the developing solution due to carbon dioxide and evaporation of the water content in the developing solution are fur ther suppressed. Accordingly, not only can the amount of replenishment of replenishing solution to the developing solution be further reduced, but also the airtightness of the washing section 24 and the finisher section 26 can be increased. Consequently, evaporation of the water content in the washing water in the washing tank 28 and in the gum solution in the gum solution tank 30 can be suppressed and the replenishment amounts of both solutions can be thereby reduced.

Moreover, by providing the shielding cover 76 in the developing section 18, the portion of the rear surface of the top cover 78 where condensation of the water occurs can be minimized. This allows several problems to be prevented, namely, unevenness in the processing of the PS plate 12 caused by condensed water droplets falling onto the PS plate 12 as it is being transported, mold caused by condensed water droplets adhering to the upper portions of the side plates 42 and the like, and clothing and the like becoming wet due to water droplets dripping down when the top cover 78 is opened.

It should be noted that a rubber blade 21 may be provided at the insertion aperture 22 to prevent air from flowing into the developing section 18.

Moreover, in the above-described structure, the shielding cover 76 was formed in a hollow box shape, however, the structure is not limited to this and the shielding cover may be formed as a solid block.

Further, the above-described embodiment is structured so that the shielding cover 76 is supported by supporting portions 15 provided integrally at four places on the tank walls of the developing tank 14 and the top of the side walls 76B are held in place by the top cover 78, however, the shielding cover may also be allowed to float on the surface of the developing solution in the developing tank 14. In this case, the surface of the developing solution can be kept at a constant level by the positioning of the distal end of an overflow pipe and by replenishing the developing solution so that the level thereof does not drop. At this time, the tops of the side walls 76B of the shielding cover 76 are normally in contact with the rear surface of the top cover 78.

If an overflow pipe is not provided then a bellows-type or fishing rod-type member capable of expanding and contracting may be provided at the top of the side walls 76B of the shielding cover 76 so that the seal between the top cover 78 and the shielding cover 76 can be maintained even when the level of the surface of the solution changes.

The sealed structure of the driving section will now be explained. As is shown in FIG. 4, driving gears 71, 82, 73, 84, and 75 for driving the pair of transporting rollers 34 (as an example) are housed between the side plate 42 and the external plate panel 20. An L-shaped lid portion 42A, extending out horizontally, is integrally molded with the side plate 42, which is screwed to the developing tank 14 so as to be integrated therewith. This lid portion 42A seals off the space between the side plate 42 and the external plate panel 20. Therefore, unlike a conventional apparatus where air can flow into the developing tank through the opening in the top of the portion where the driving gears are located and contact with the surface of the developing solution, the airtightness of the seal of the developing tank 14 can be improved.

It should be noted that the side plate 42 may be integrally molded with the developing tank 14 or welded so as to become an integral structure therewith.

The first part of the roller supporting structure is explained below. In order to detach the transporting rollers from the developing tank, it is normally necessary to remove the bearings attached to the rotating shaft and the gears as well. Accordingly, the task of detaching and replacing the transporting rollers is complicated. In addition, it is necessary to form grooves in the side plates of the developing tank for inserting the bearings and the gears and air is able to flow into the developing tank through these grooves so that a structure able to cut off the flow of air into the developing tank cannot be achieved.

Figure 5:
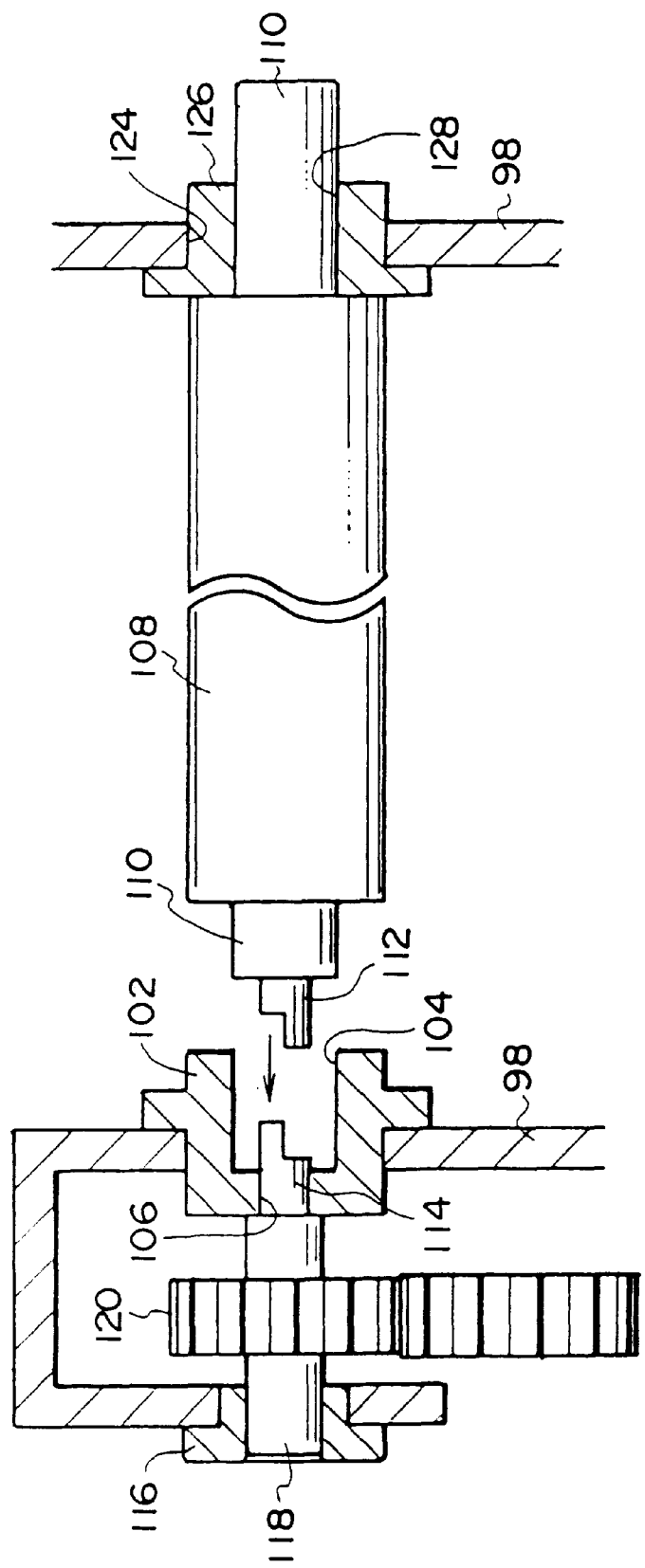
FIG. 5 is a cross-sectional view showing a bearing section of the roller of the PS plate processor of the present embodiment.
Figure 6:
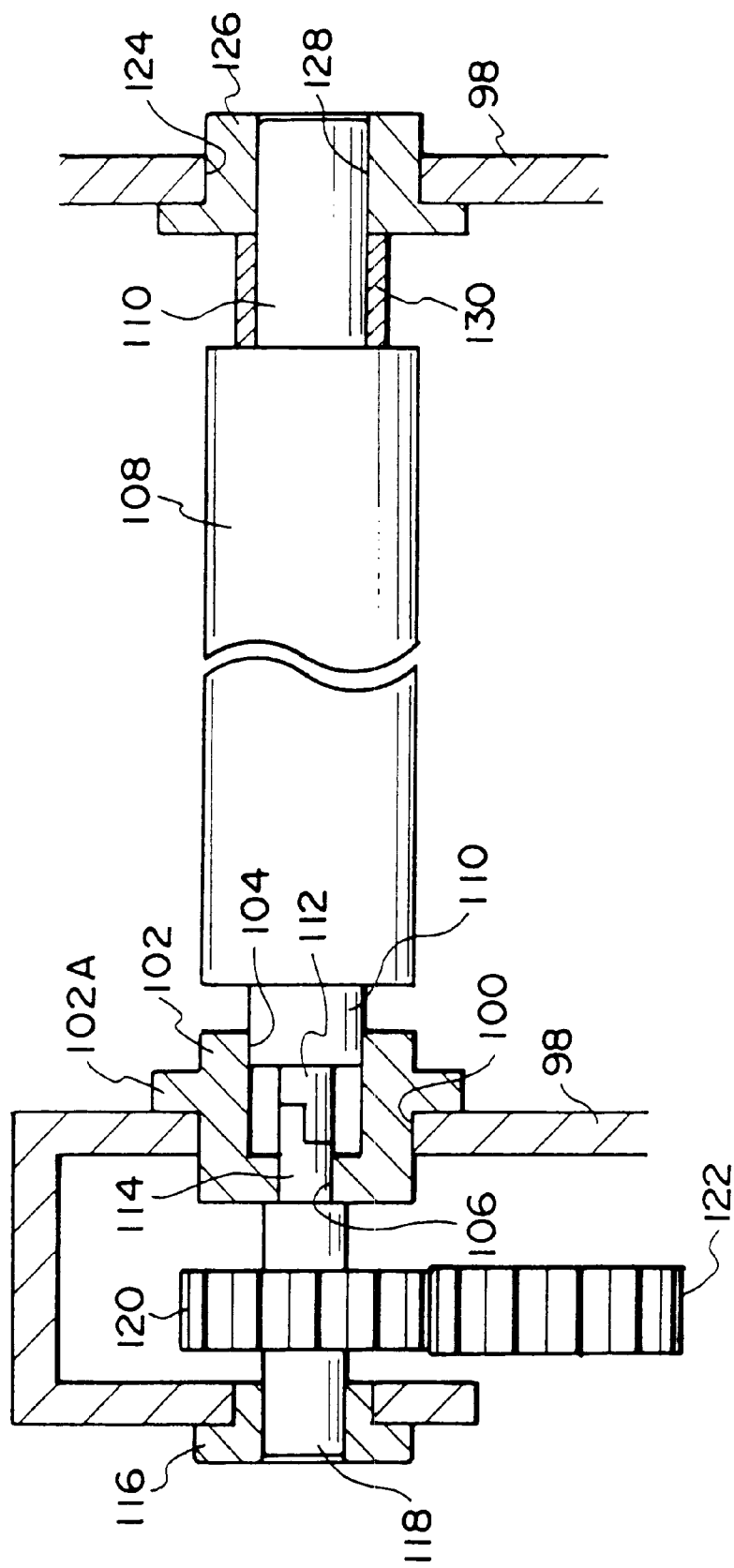
FIG. 6 is a cross-sectional view showing another bearing section of the roller of the PS plate processor of the present embodiment.

In order to counter this, the supporting structure shown in FIGS. 5 and 6 has a mounting hole 100 formed in the left-hand side plate 98. A bearing 102 shaped as a hollow cylinder is inserted into the mounting hole 100 and fixed therein. A stopper 102A on the bearing 102 extends in the radial direction thereof and determines the insertion amount of the bearing 102 by abutting the bearing against the side plate 98.

Moreover, a large shaft hole 104 and a small shaft hole 106 are formed coaxially in the bearing 102. A rotating shaft 110 of the transporting roller 108 is rotatably supported by the shaft hole 104. A coupling shaft 112 used for coupling protrudes from the end portion of the rotating shaft 1 10.

Figure 7:
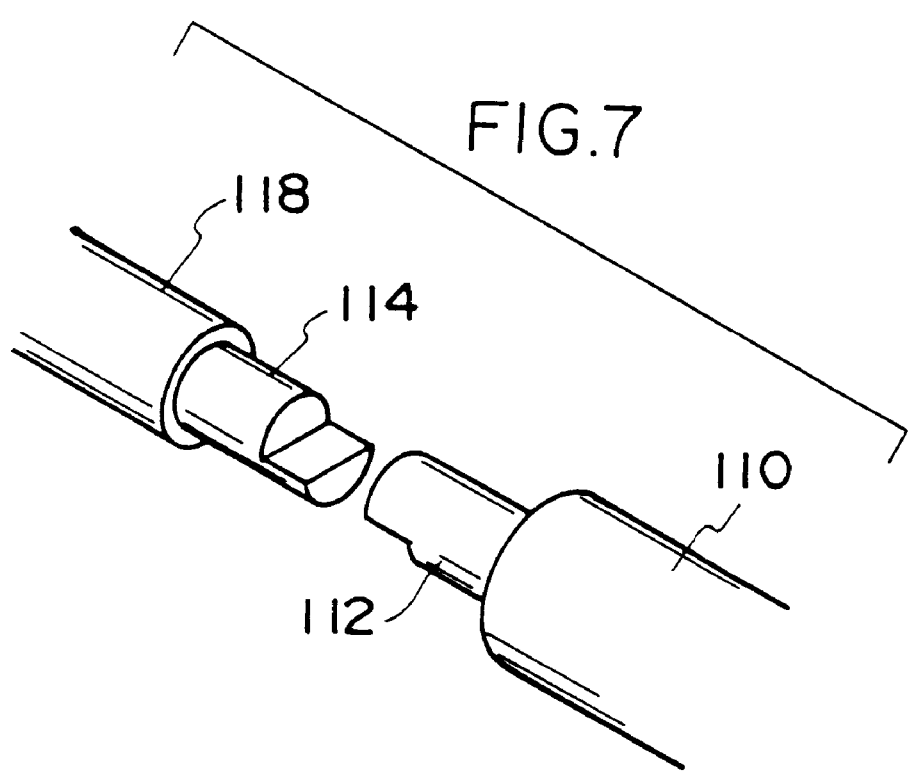
FIG. 7 is a perspective view showing a coupling structure used in the gear section of the PS plate processor of the present embodiment.

The distal end portion of the linking shaft 112 is cut in a semicircle along the center of the axis, as is shown in FIG. 7. A coupling shaft 114, whose distal end is also cut in a semicircle along the center of its axis, is rotatably supported by the shaft hole 106 in such a way that it can couple with the coupling shaft 112.

The coupling shaft 114 protrudes from the end of a shaft 118 whose other end is supported by a bearing 116. A driving gear 120 is fixed to the shaft 118 and a driving force is transmitted to the shaft 118 via a transmission gear 122.

A bearing 126 is inserted into a mounting hole formed in the other side plate 98 on the right hand side and is fixed thereto. The rotating shaft 110 of the transporting roller 108 is rotatably supported in the shaft hole 128 of the bearing 126 and a C-shaped spacer 130 is inserted between the bearing 126 and the roller portion of the transporting roller 108.

In this type of structure, to set the transporting roller 108 in place, firstly, as is shown in FIG. 5, the right-hand end portion of the rotating roller 110 is inserted deep into the shaft hole 128 of the bearing 126. Next, as is shown in FIG. 6, the rotating shaft 110 is pulled out towards the left-hand side and the coupling shaft 112 is inserted into the shaft hole 104 of the bearing 102. The coupling shaft 112 is thereby coupled with the coupling shaft 114 and the driving force from the driving gear 120 is transmitted to the rotating shaft 110 via the linking shafts 114 and 112.

After the coupling shafts 112 and 114 have been coupled together, the spacer 130 is inserted onto the rotating shaft 110 so as to prevent the transporting roller 108 moving in the axial direction as it turns and thereby uncoupling the coupling section. It should be noted that the above-described process is carried out in reverse in order to remove the transporting roller 108.

In this way, by inserting a bearing into the shaft hole and making the transporting roller detachable from the bearing, the developing tank can be completely sealed with no gaps. Moreover, the task of detaching and replacing the transporting rollers can be accomplished in a short time.

By using the above-described coupling structure, it is no longer necessary to fix the gears and shafts using screws or the like, and thus trouble in the drive transmission system due to screws becoming loose can be prevented.

An explanation will now be given based on FIGS. 8 and 9. The rotating shaft 140 of the transporting roller 132 is rotatably supported by the bearing 138 mounted in the side plate 134. A driving gear 142 is fixed to the rotating shaft 140 and meshes with a transmission gear 144 disposed between the side plate 134 and the external plate panel 136.

A boss 146 is integrally molded with the transmission gear 144 at the center thereof. The distal end portion of the boss 146 is cut in a semicircle along the axis thereof. The boss 146 is slid onto a shaft 152 extending from the side plate 134 to the external plate panel 136 so that it can freely rotate.

A helical gear 148 with which the boss 150 integrally molded at its center is slid onto the shaft 152. The distal end of the boss 150 is cut in a semicircle along its axial center and is coupled with the boss 146. Accordingly, when a driving force is transmitted to the helical gear 148 from a worm gear 154, the helical gear 148 rotates integrally with the transmission gear 144 and drives the driving gear 142 to rotate.

In this way, by adopting a structure where the boss 146 and the boss 150 are both cut in semicircle shapes and molded integrally with the transmission gear 144 and the helical gear 148 respectively and rotated around the shaft 152, the necessity, of screwing the transmission gear 144 to the boss 146 and the helical gear 148 to the boss 150 is done away with and problems such as the screws becoming loose can be eliminated.

Figure 10:
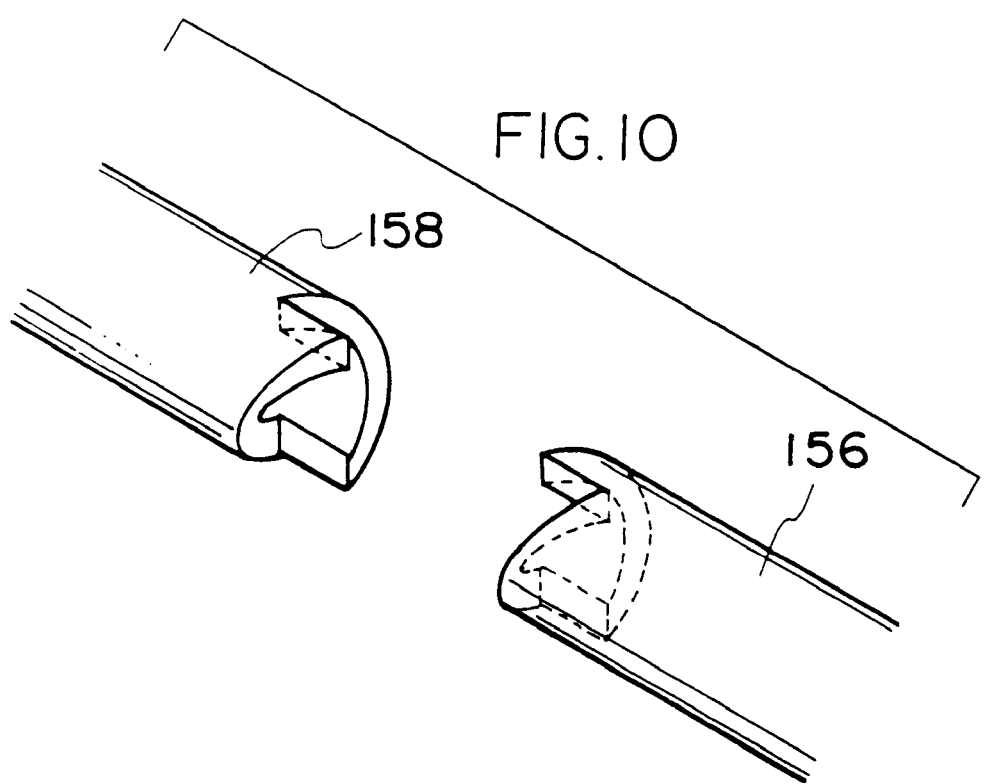
FIG. 10 is a is a perspective view showing a further coupling structure used in the gear section of the PS plate processor of the present embodiment.
Figure 11:
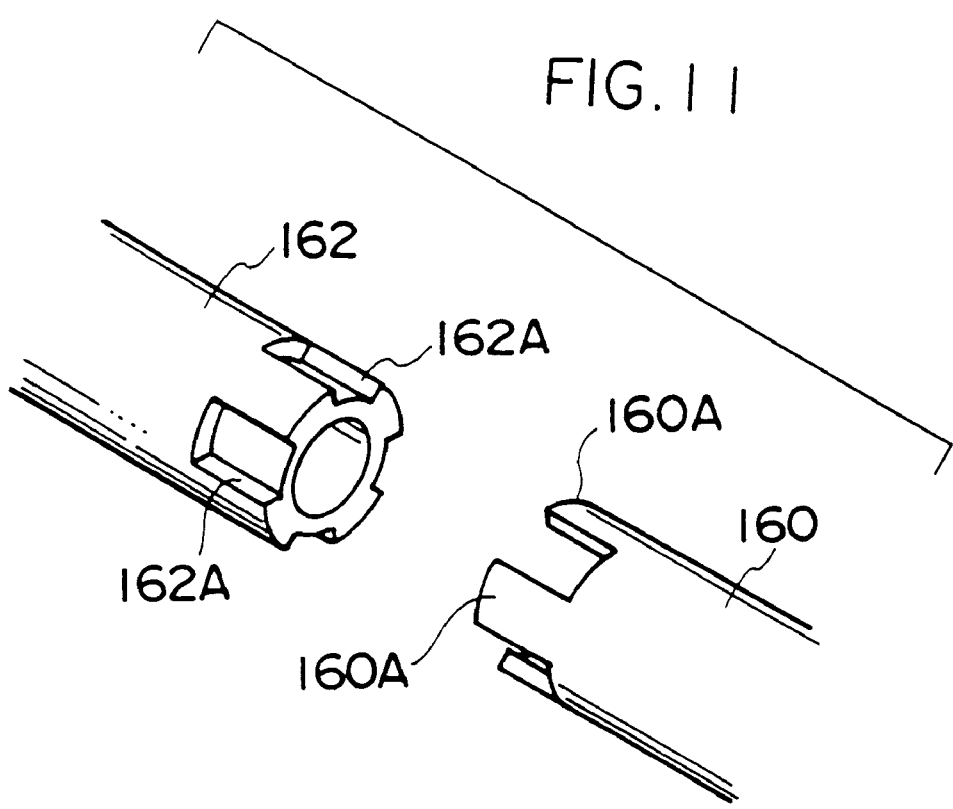
FIG. 11 is a is a perspective view showing yet a further coupling structure used in the gear section of the PS plate processor of the present embodiment.

The couplings can be formed in a screw shape as with the bosses 156 and 158 shown in FIG. 10 or, as is shown in FIG. 11, with concave portions 162A formed at predetermined intervals in the circumferential direction in the outer surface of the boss 162 and with four protruding fingers 160A formed in the boss 160 so as to engage with the concave portions 162A. This structure allows the coupling operation of the bosses 162 and 160 to be carried out rapidly.

Figure 12:
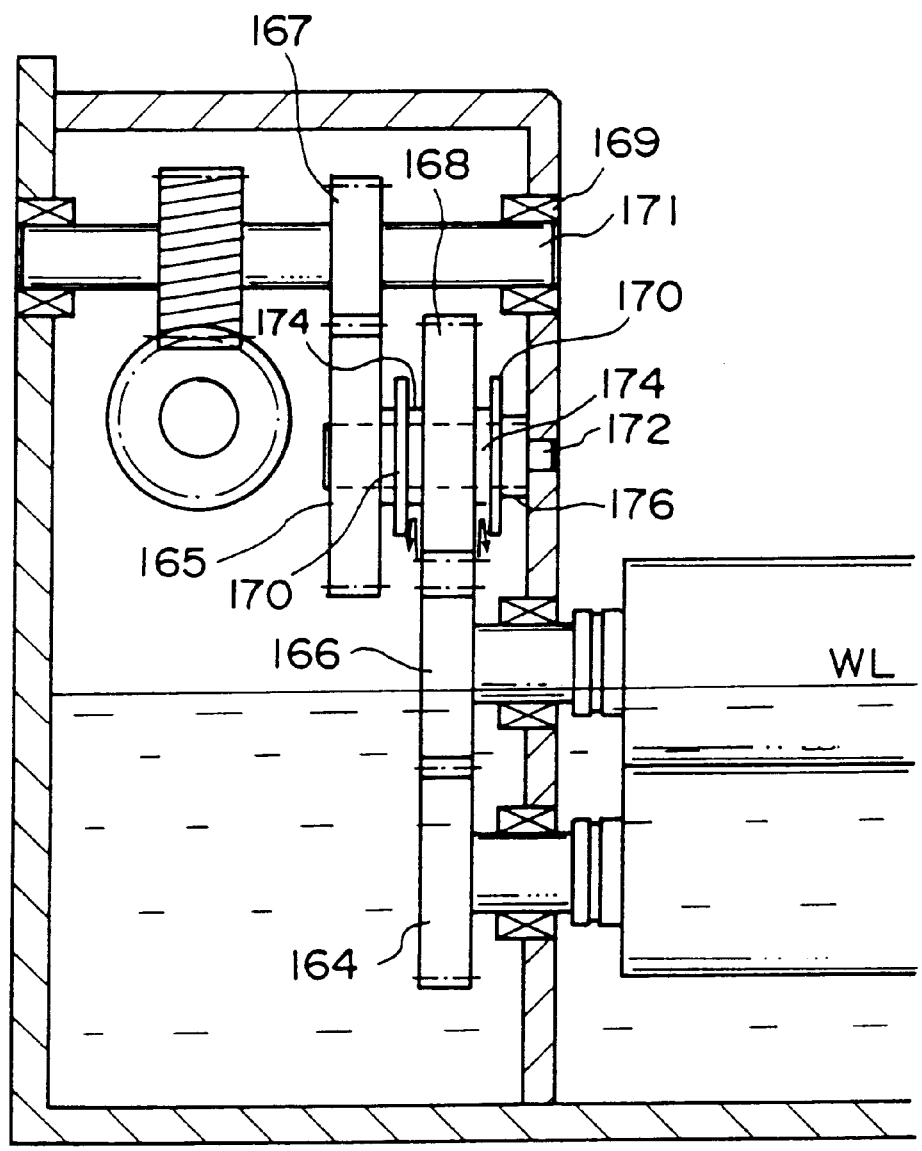
FIG. 12 is a side view showing the liquid isolation structure of the gear section of the PS plate processor of the present embodiment.

The second part of the roller supporting structure is explained below. A feature of the PS plate processor 10 which uses processing solutions is that, as is shown in FIG. 12, through the rotation of the gears of the driving system, processing solution is drawn up by the gear 166 which operates in the solution and is raised up as far as the driving gear 168.

Because of this, flanges 170 are provided on both sides of the driving gear 168 creating a return groove 174. The return grooves 174 prevent the solution from running along the shaft 176 and seeping into the gap between the shaft 172 and the shaft 176 which rotates around the shaft 172. Likewise, the return grooves 174 prevent solution from running along the shaft 176, and the gears 165 and 167 and seeping into the gap between the bearing 169 and the rotating shaft 171.

By blocking the solution in this way, foreign matter, such as dregs, in the processing solution can be prevented from coming between the rotating shaft 172 and the shaft 176 and between the bearing 169 and the rotating shaft 171 and thus abrasion of the rotating shaft 172, the shaft 176, the bearing 169, and the rotating shaft 171 can be prevented.

Figure 13:
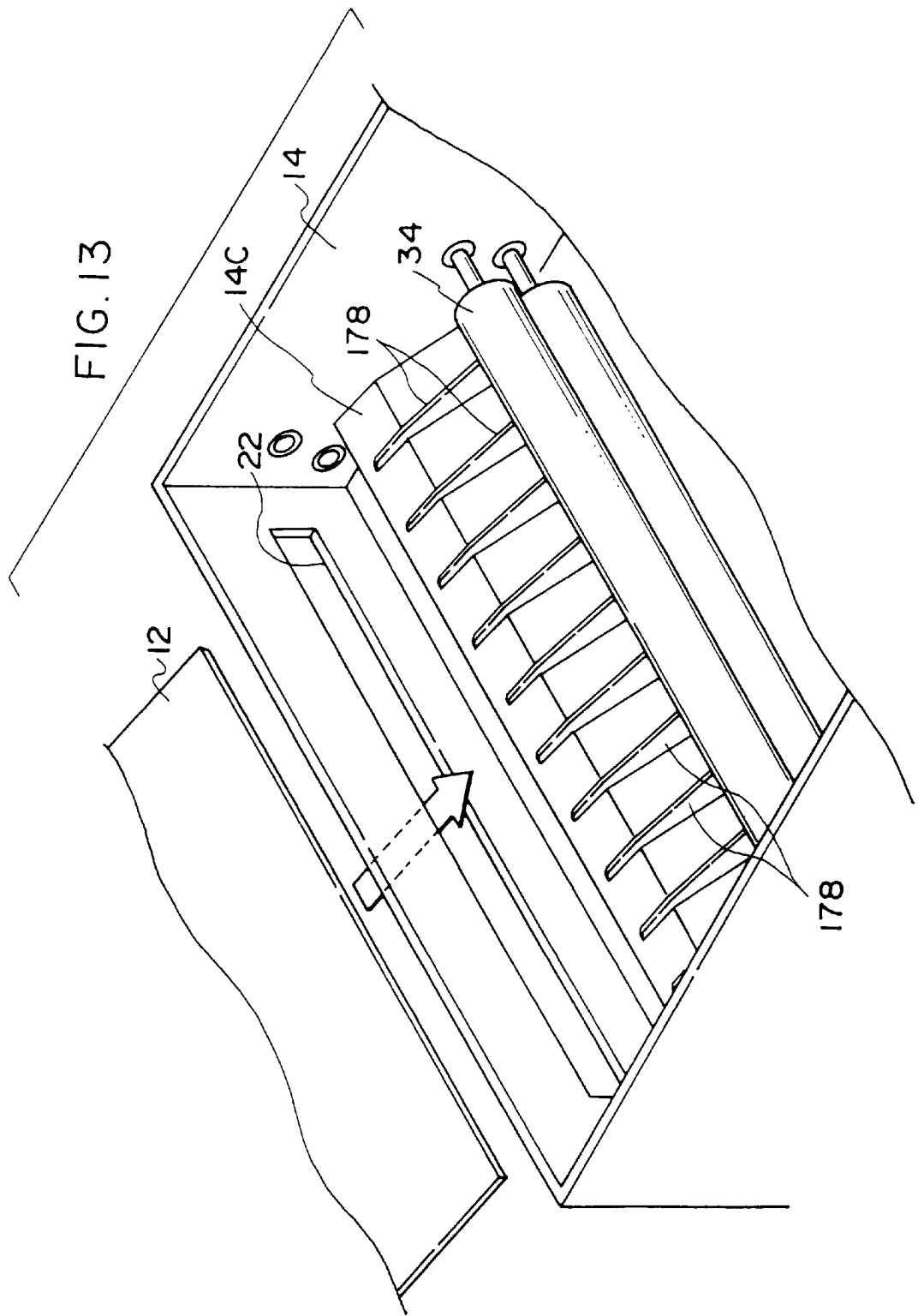
FIG. 13 is a perspective view showing the ribs in the developing tank of the PS plate processor of the present embodiment.
Figure 14:
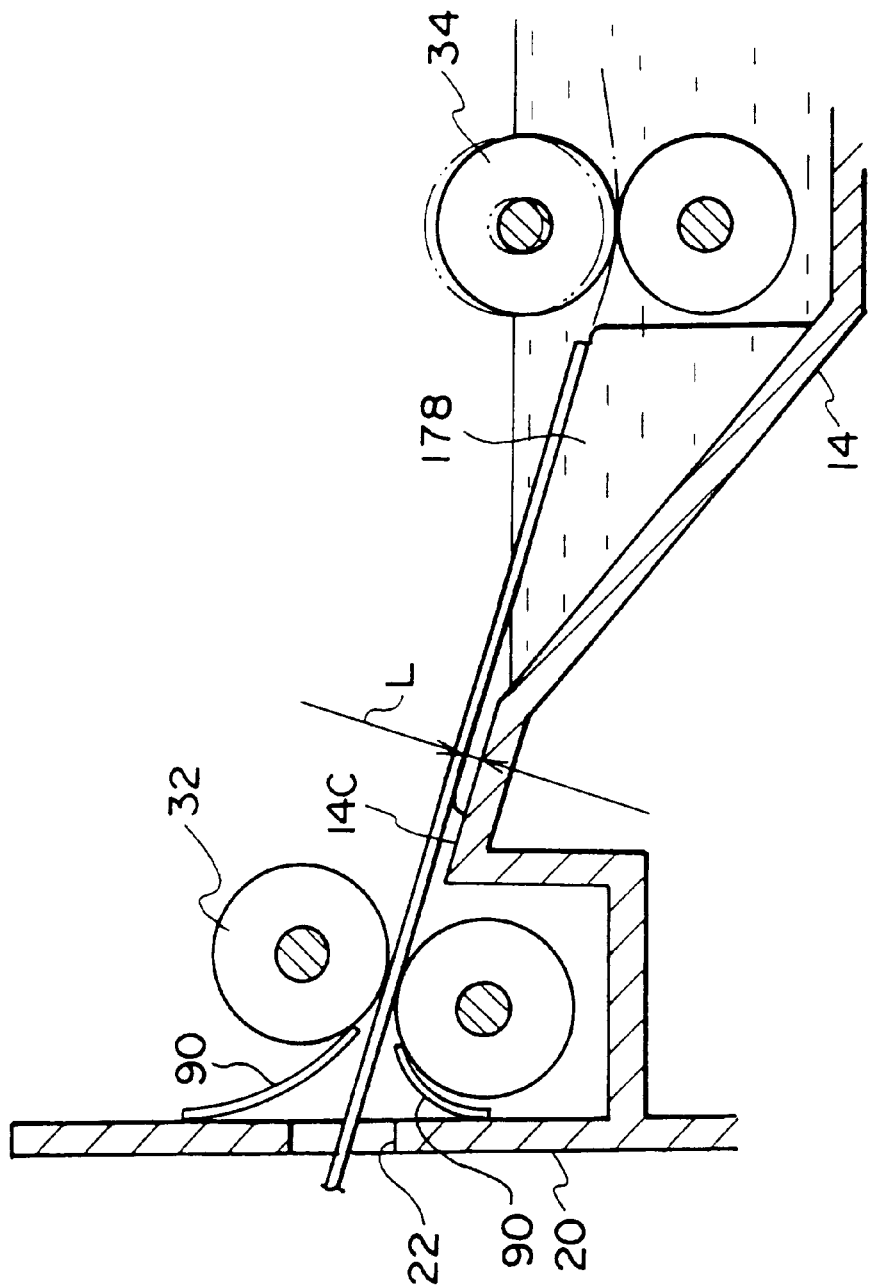
FIG. 14 is a cross-sectional view showing the relationship between the ribs in the developing tank and the PS plate of the PS plate processor of the present embodiment.

The transporting guides for the developing tank will now be explained. As is shown in FIGS. 13 and 14, guide ribs 178 are provided at predetermined intervals on the slanted bottom wall of the developing tank 14 near the insertion aperture 22. The upper surfaces of these guide ribs 178 are positioned on the transporting path formed by the transporting rollers 32 and the transporting rollers 34 and slant in the same direction as the slanting bottom wall of the developing tank 14. The height L of the guide ribs 178 above the inserting surface 14C of of the PS plate into the developing tank 14 is set at, for example, 5 mm.

The reason for providing this type of structure is the concern that, as in the conventional system, when the PS plate 12 is inserted through the insertion aperture 22 and guided towards the transporting rollers 34 while contacting with the bottom wall of the developing tank 14, the developing solution will spread upwards by wetting along the contact surface between the PS plate 12 and the bottom wall of the developing tank 14 and will be taken out of the developing tank 14.

Moreover, by using the above-described structure, a sufficient gap is created between the PS plate 12 as it is being transported and the bottom wall of the developing tank 14 by the guide ribs 78 so that no wetting can occur. The guide structure can thus be made free from leaking solution. It should be noted that, in the present example, the height L of the guide ribs is set at 5 mm, however, this height is s et according to the nature of the developing solution (the intervals between the guide ribs also depends on the nature of the developing solution).

The backup structure of the brush rollers will now be explained. As is shown in FIG. 1, the front and rear surfaces of the PS plate 12 are rubbed by brush rollers 36 and 38 in the PS plate processor 10 thereby accelerating the developing and removing the photosensitive layer from non-image portions. Backup rollers 44, 46, and 48 are provided as supports for the PS plate 12 during this process.

However, providing backup rollers increases costs. Therefore, instead of the rollers, a guide plate over which the PS plate can easily pass can be considered as a support for the PS plate 12. However, it is necessary for the non-image portions of the photosensitive layer of the PS plate 12 to be removed by the rotation of the brush roller with the bristles of the brush roller pushed against the guide plate. Therefore the concern exists that the bristles of the brush roller might develop a bent characteristic if left pressed against the guide plate when the PS plate processor is not in use, thereby reducing the rubbing performance of the brush roller.

Figure 15:
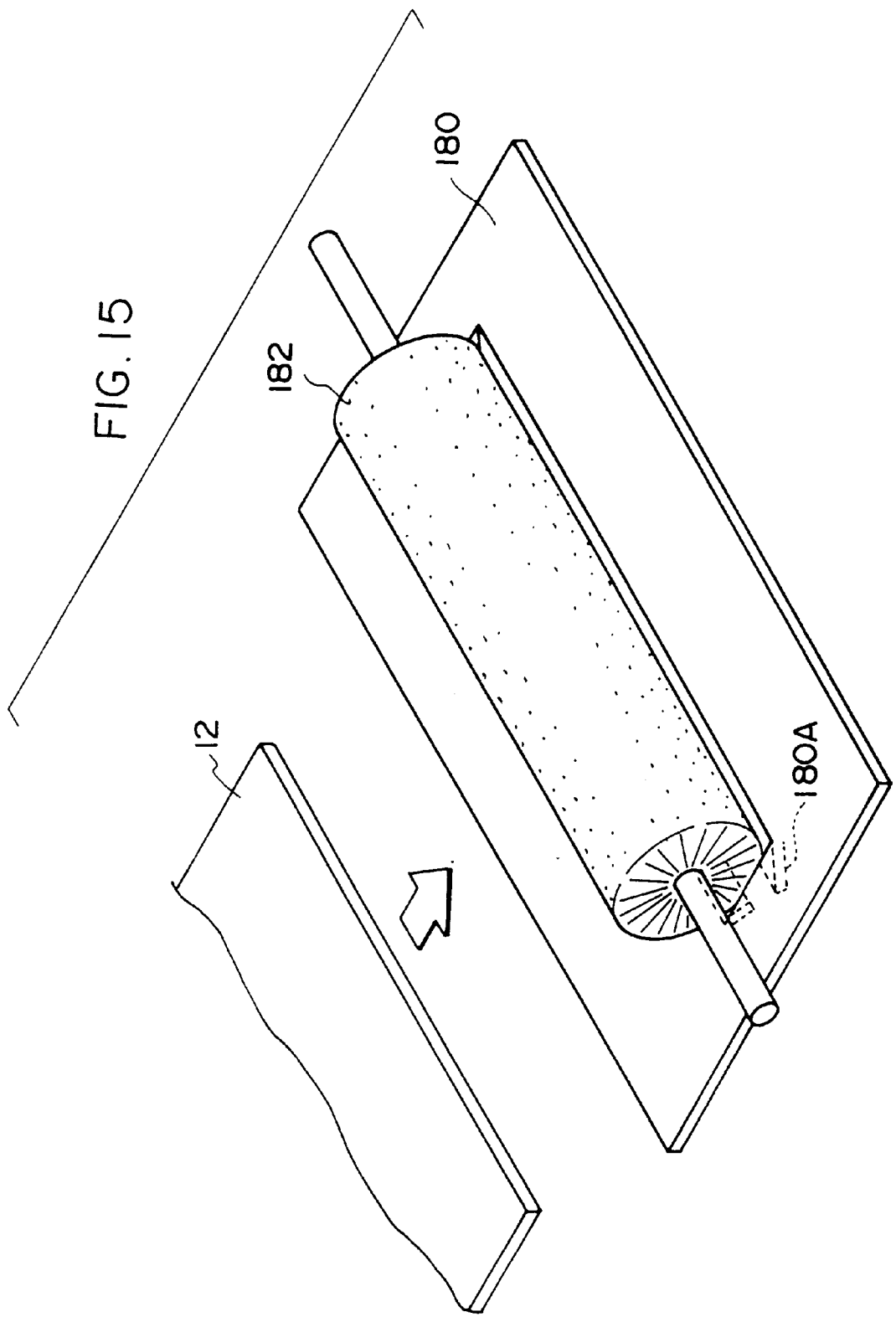
FIG. 15 is a perspective view showing a back-up structure for a brush roller of the PS plate processor of the present embodiment.
Figure 16:
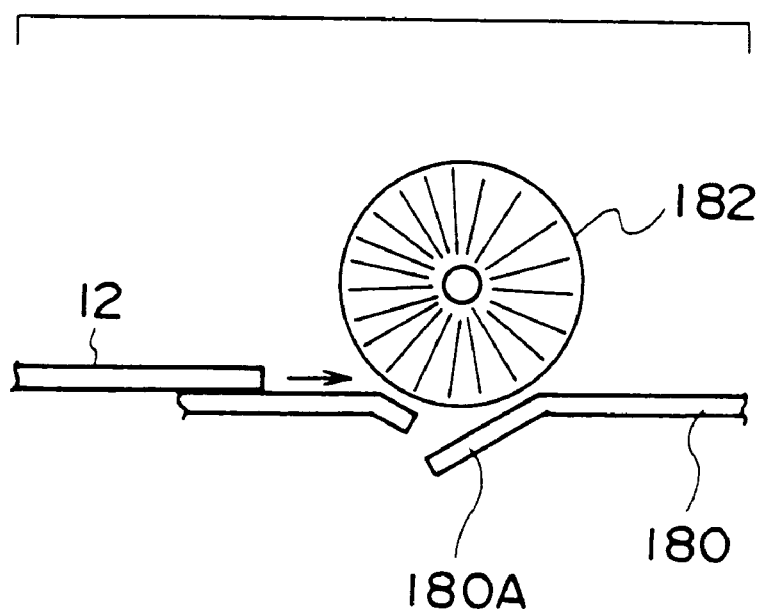
FIG. 16 is a side view showing a back-up structure for a brush roller of the PS plate processor of the present embodiment.

For this reason, the structure shown in FIGS. 15 and 16 is proposed as an example of an improvement where an open slit is formed in the portion of the guide plate located below the brush roller 182 so that the brush roller 182 does not contact with the guide plate 180.

Figure 17:
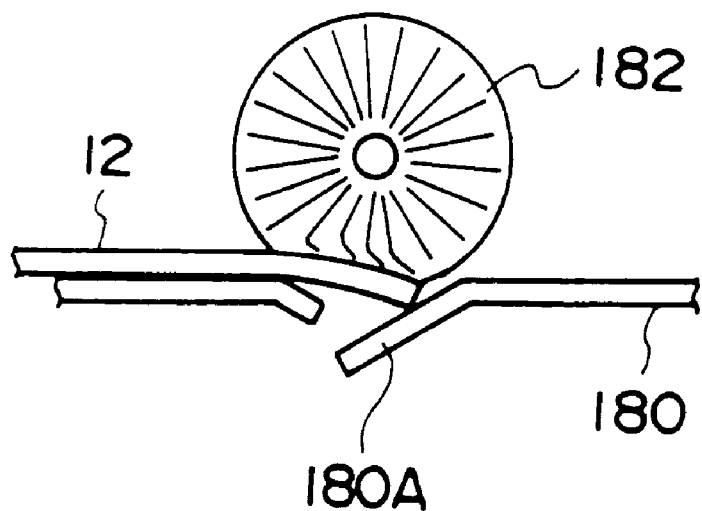
FIG. 17 is a side view showing a back-up structure for a brush roller of the PS plate processor of the present embodiment.
Figure 18:
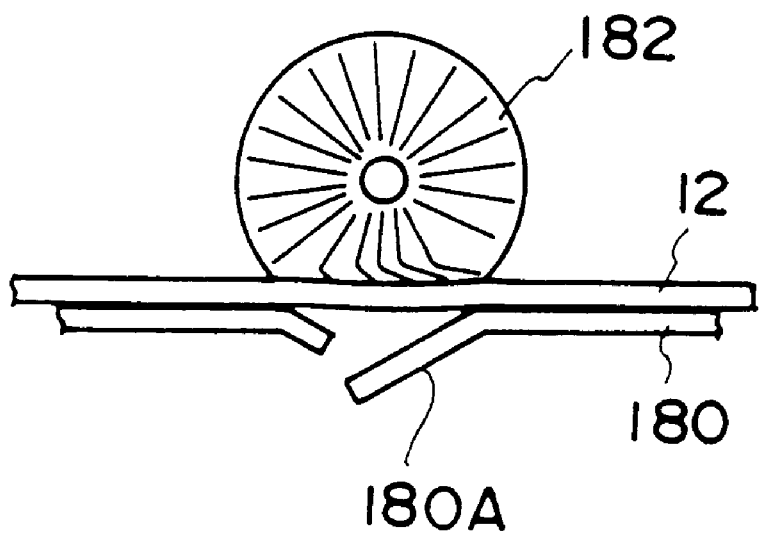
FIG. 18 is a side view showing a back-up structure for a brush roller of the PS plate processor of the present embodiment.

In this structure, as is shown in FIG. 17, the leading end of the PS plate 12 collides against the guide piece 180A, which is inclined downwards so as to face the opposite direction to the transporting direction of the PS plate 12, and is guided upwards. Thereafter, as is shown in FIG. 18, the PS plate 12 moves across the guide plate 180 while the non-image portions of the photosensitive layer thereof are rubbed off by the brush roller 182.

In this way, when the PS plate processor is not in use, the bristles of the brush roller 182 are not pressed against the guide plate 180 and thus no bent characteristic develops in the bristles. Accordingly a stable rubbing function is exhibited. Moreover, by forming an opening in the guide plate 180, any foreign material in the developing solution is not left on the surface of the guide plate 180 and thus contamination of the surface of the PS plate can be prevented.

Figure 19:
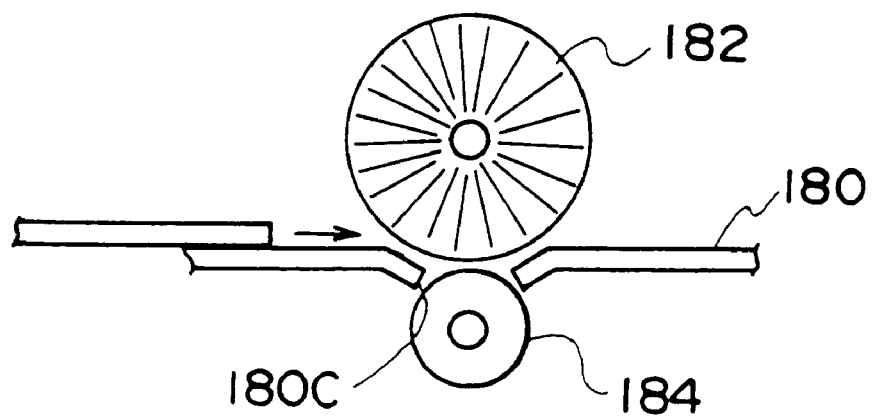
FIG. 19 is a side view showing another back-up structure for a brush roller of the PS plate processor of the present embodiment.
Figure 20:
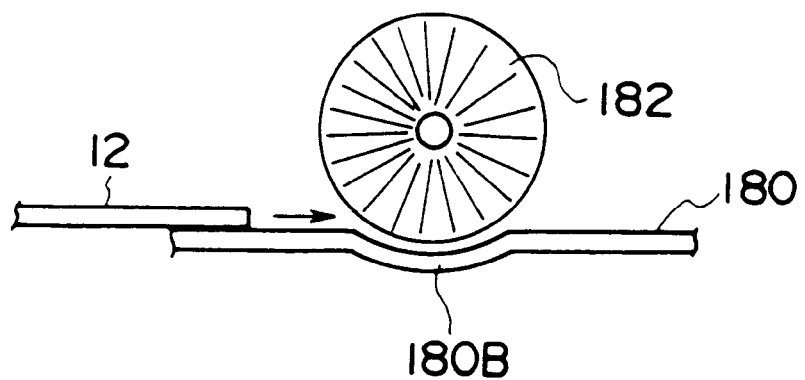
FIG. 20 is a side view showing a further back-up structure for a brush roller of the PS plate processor of the present embodiment.

A slit may also be cut in the guide plate 180 at the position where it touches the bristles of the brush roller 182 and the edge portions of the guide plate 180 bent downwards to create an opening 180C, as shown in FIG. 19, an d a skewer roller 184 disposed in the middle of the opening 180C. The leading end of the PS plate 12 can be guided smoothly by the skewer roller 184.

Alternatively, a concavely curved portion 180B may be provided instead of an opening to ensure that the bristles of the brush roller 182 do not contact with the guide plate 180. This structure is easily fabricated simply by pressing out the surface of the guide plate 180.

The supporting structure of the skewer rollers will now be explained. As was stated above, skewer rollers may be provided as backup rollers for the brush rollers in the developing tank 14. These skewer rollers are not required to be self-propelled so are therefore supported in a state where both ends of the stay are inserted into bearings provided in the side plates.

However, this makes the task of reinserting the skewer rollers complicated when the skewer rollers are taken out to be cleaned.

Figure 21:
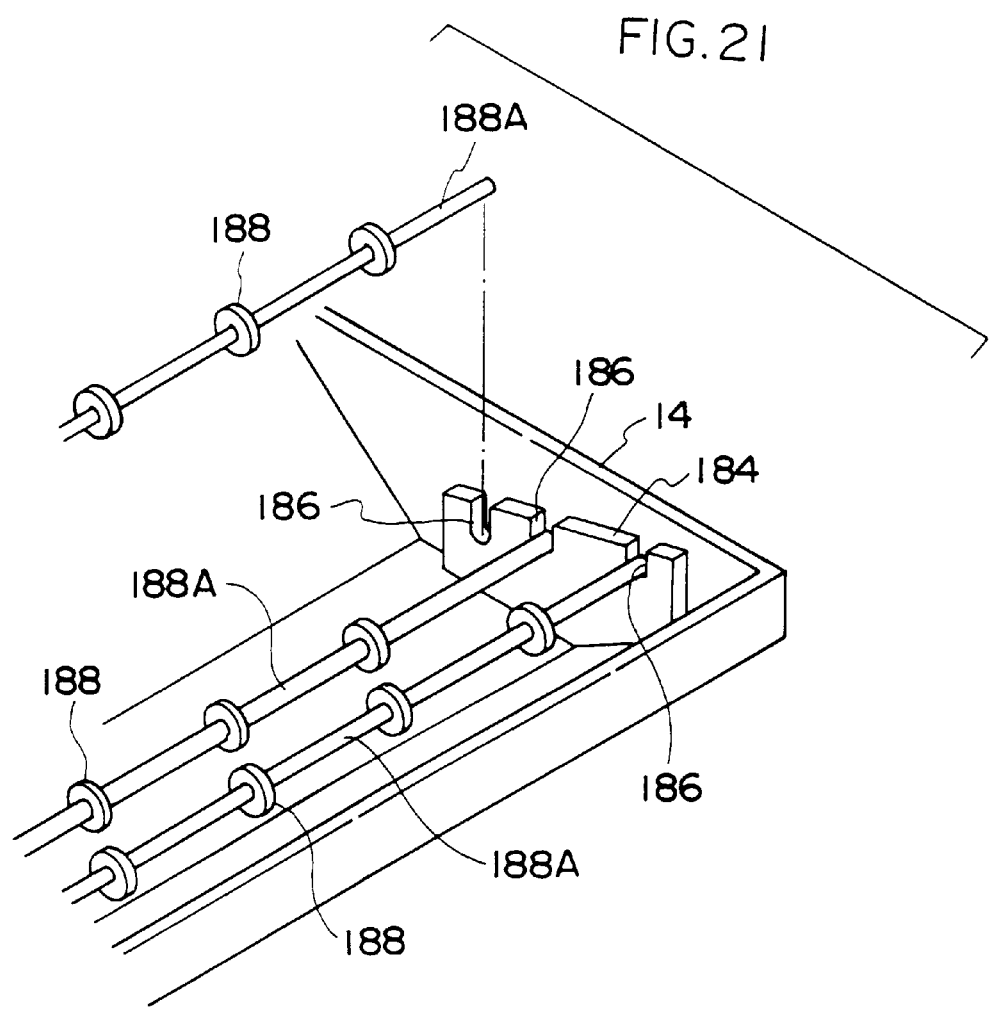
FIG. 21 is a perspective view showing a supporting structure of the skewer rollers of the PS plate processor of the present embodiment.

For this reason, as is shown in FIG. 21, it is proposed that receiving plates 184, having supporting portions 186 provided in the top thereof, are molded integrally with the developing tank 14 and the stays 188A of the skewer rollers 188 are supported by being lowered in from above. This structure removes the necessity of inserting the stays in bearings, as in a conventional structure, thereby facilitating the removal and replacement of the skewer rollers.

Figure 22:
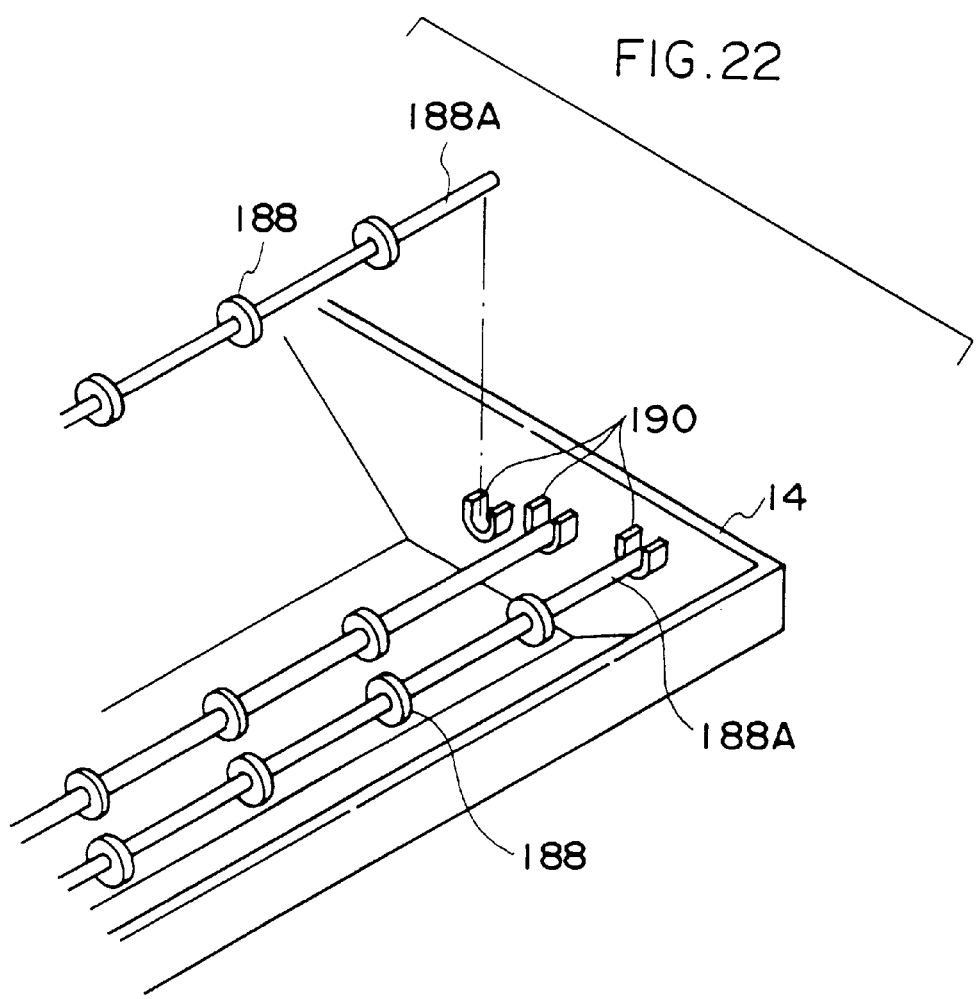
FIG. 22 is a perspective view showing another supporting structure of the skewer rollers of the PS plate processor of the present embodiment.

Alternatively, as is shown in FIG. 22, in order to reduce the amount of material used to mold the receiving plate 184, U-shaped support portions 190 can be molded integrally with the side wall of the developing tank 14 with the stays 188A of the skewer rollers 188 lowered from above.

The method of producing the skewer rollers will now be explained. Conventional skewer rollers are produced by press-fitting a cylindrical pipe formed from PVC (polyvinyl chloride) resin into round holes provided at the center of each of a plurality of rubber rollers and inserting a stay through the cylindrical pipe. The cylindrical pipe functions as a spacer maintaining a uniform distance between the rubber rollers.

However, the task of press-fitting the cylindrical pipe into the round holes in the rubber rollers is difficult and requires a substantial amount of labor.

Figure 23:
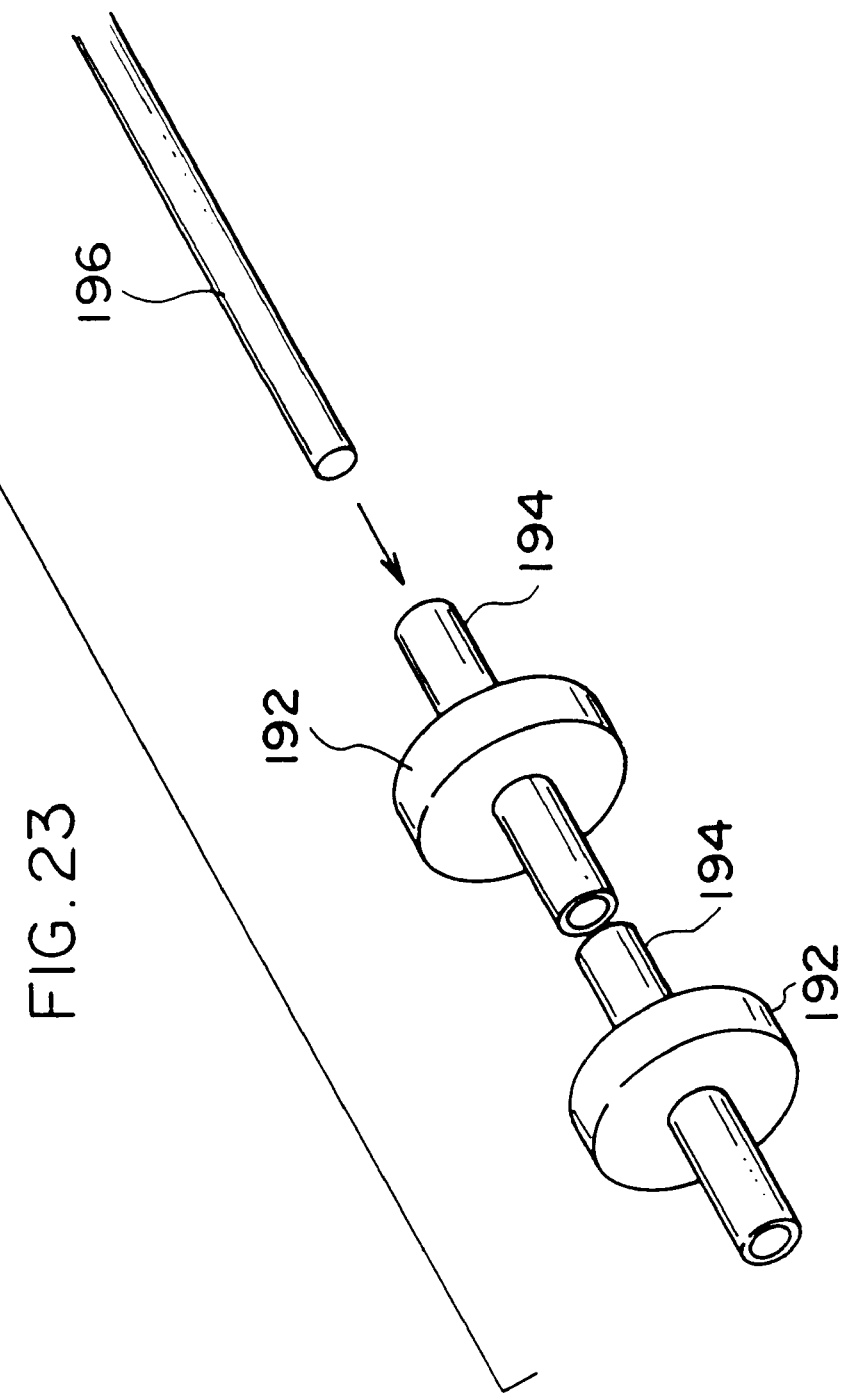
FIG. 23 is an exploded perspective view showing the structure of the skewer rollers of the PS plate processor of the present embodiment.

For this reason, by a double molding process integrating the circular plate-shaped roller 192 and the cylindrical pipe-shaped spacer 194, as is shown in FIG. 23, the assembly man-hours can be reduced. It should be noted that the roller 192 is molded from rubber or elastomer (specifically, Santoplane (trade name)) and the spacer 194 is molded from PP (polypropylene) resin.

Accordingly, the skewer roller is completed simply by inserting the stay 196 through the spacer 194 molded integrally with the roller 192.

Figure 24:
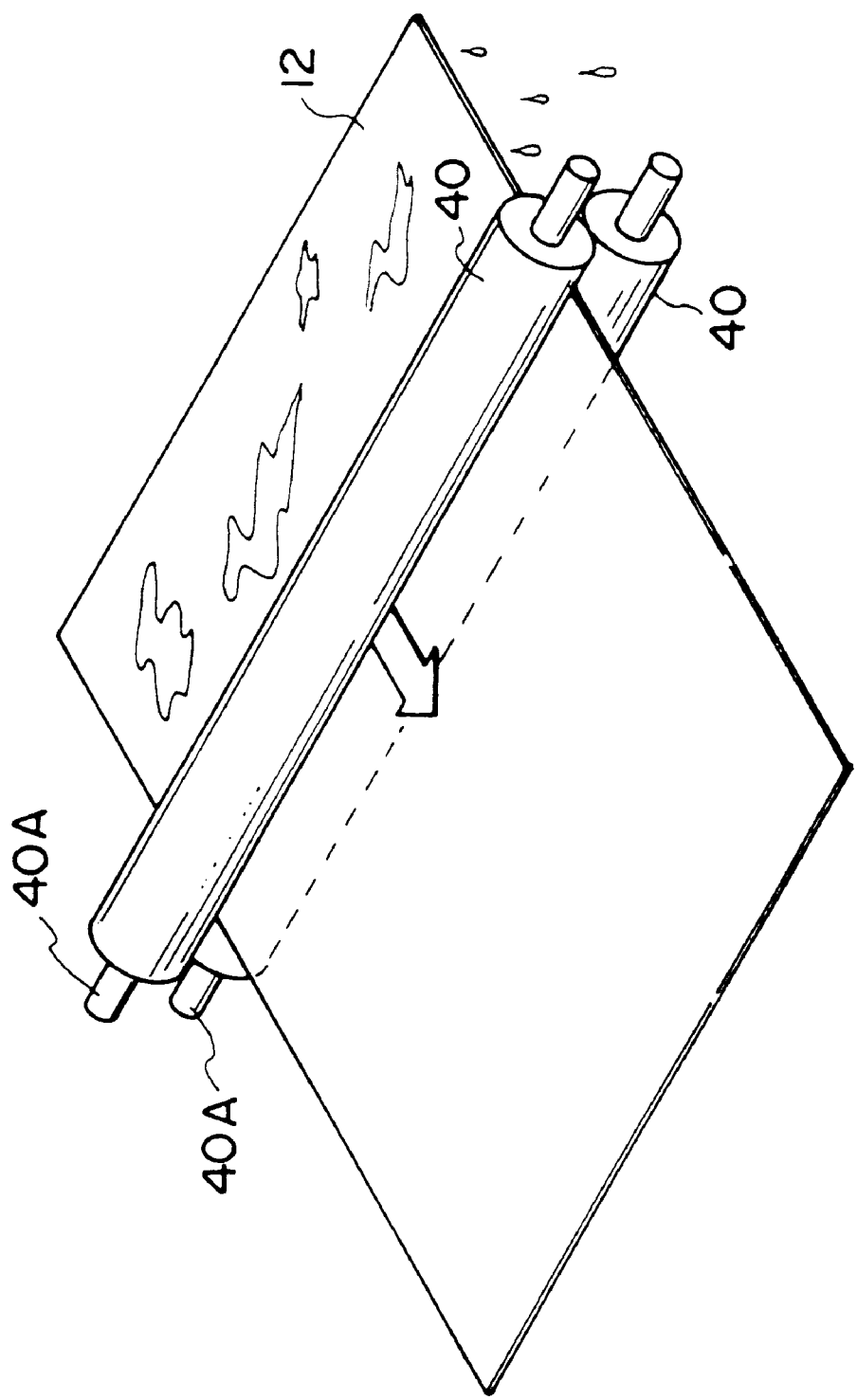
FIG. 24 is a perspective view showing the structure of the squeezing roller of the PS plate processor of the present embodiment.

The squeezing rollers will now be described. As is shown in FIG. 1 and FIG. 24, a PS plate 12, which has completed the developing process, is pulled out of the developing tank 14 while developing solution is squeezed off it by the squeeze rollers 40 and is then transported to the washing section 24.

Figure 26A:
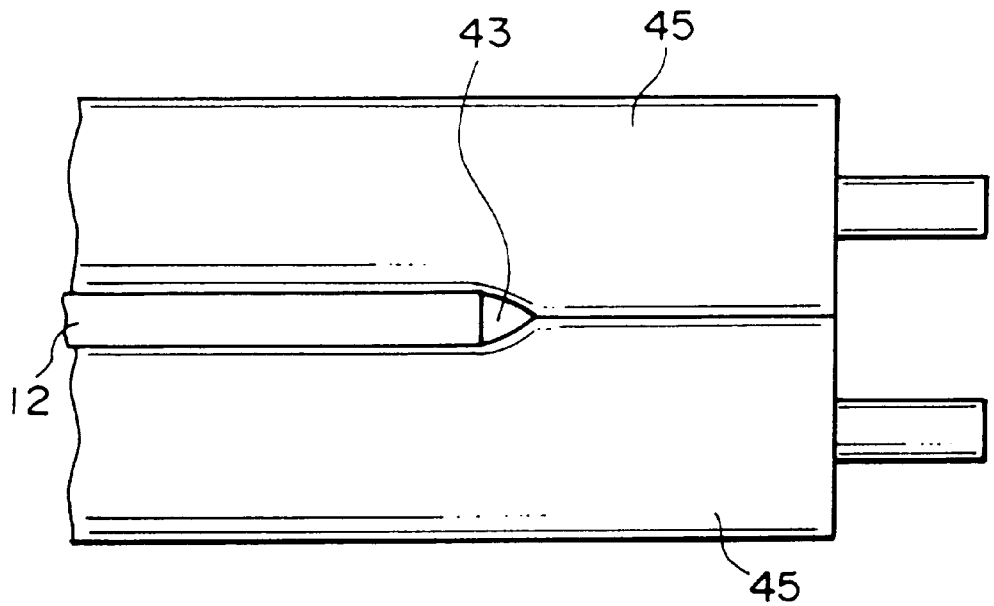

At this stage, as is shown in FIG. 26A, if the squeezing roller is a roller having a uniform hardness, gaps 43 are created next to the edge portions of the PS plate 12 which is being nipped and transported. Developing solution is thereby not sufficiently taken off and some remains on the squeezing rollers 45. This ends up adhering to the edge portions of the PS plate 12 when it passes between the squeezing rollers 45 thereby causing insufficient squeezing.

Figure 25:
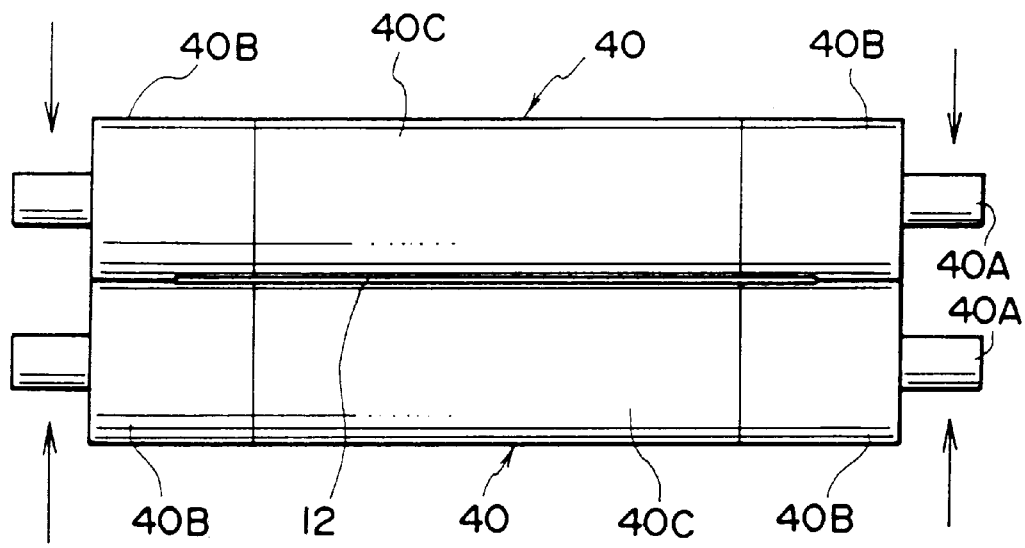
FIG. 25 is a front view showing the squeezing rollers of the PS plate processor of the present embodiment.
Figure 26B:
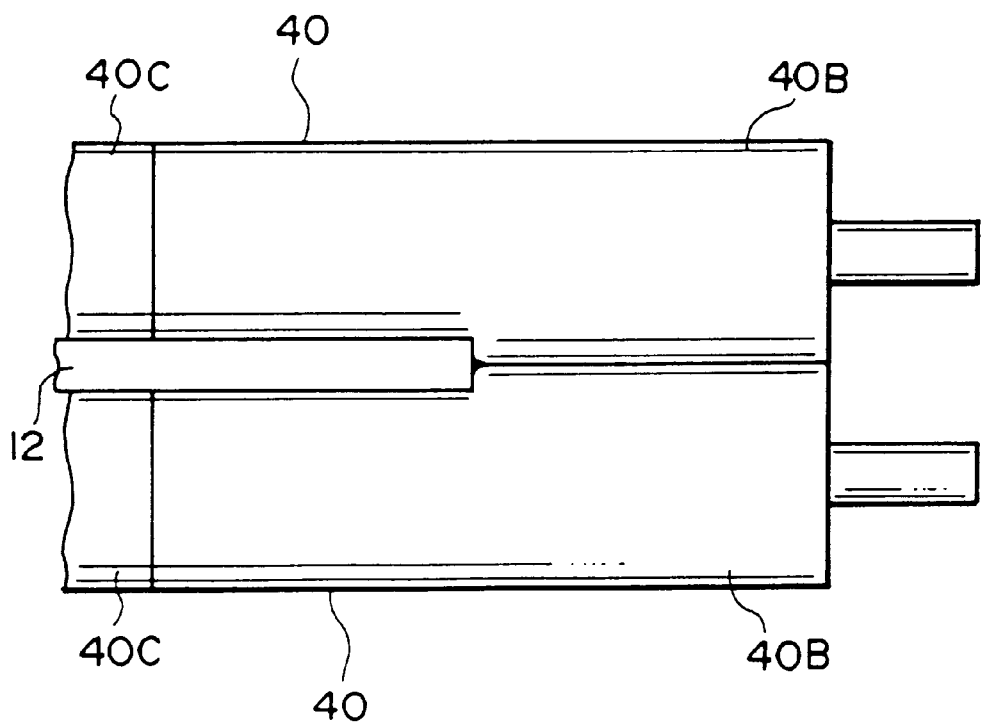
FIG. 26(B) is a front view showing the state when squeezing rollers of the present embodiment squeeze a PS plate.

For this reason, as is shown in FIG. 25, both end portions 40B of each of the squeezing rollers 40 which contact with the two edge portions of the PS plate 12 are made from a soft rubber while the central portions 40C are made from a hard rubber. Therefore, as is shown in FIG. 26B, the ability to reliably nip and transport the PS plate 12 is maintained by the hard rubber portions in the center portions 40C of the squeezing rubbers 40, while the soft rubber sections 40B at the edges in the transverse direction of the PS plate conform to the edge shape of the PS plate 12 allowing no gap to be created. The developing solution adhering to the PS plate 12 can therefore be reliably squeezed off by the squeezing rollers 40 with no residual developing solution left at the edges of the PS plate 12.

The above-described structure may, of course, be appropriately used for other squeezing rollers such as the pairs of squeezing rollers 54 and 56 disposed in the washing section 24 and the pair of squeezing rollers 60 disposed in the finisher section 26.

The structure for preventing the bearing from becoming detached will now be described. Normally, an E ring is attached to the rotating shaft of a roller to prevent the bearing from becoming detached from the rotating shaft. However, this necessitates creating an attachment groove in the rotating shaft and a device for mounting the E ring is also required.

Figure 27:
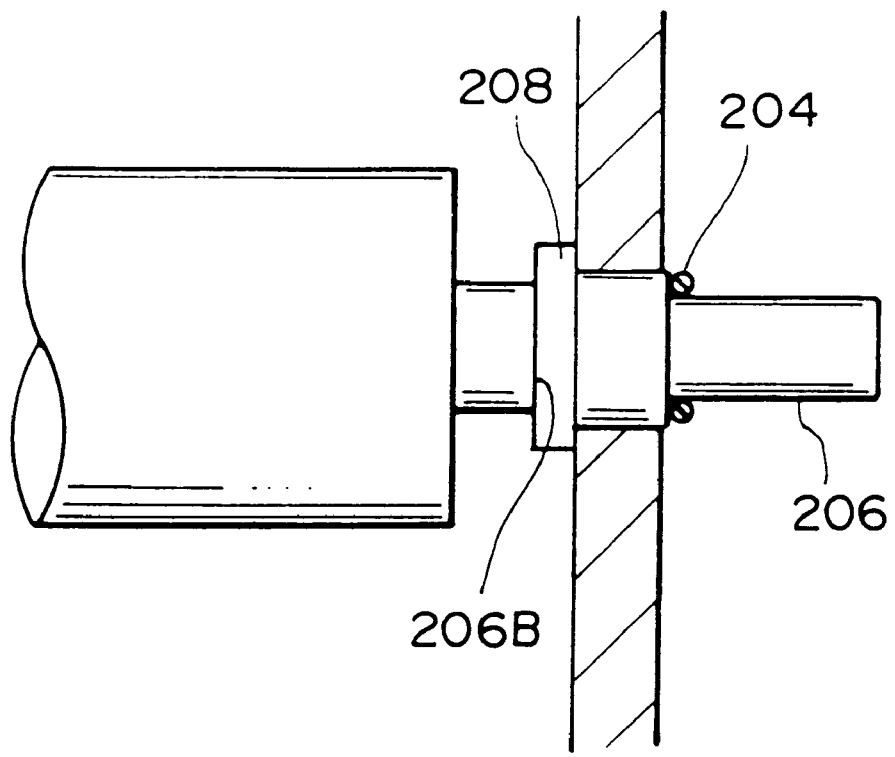
FIG. 27 is a front view of the main portions of a structure for preventing the shaft from falling out of the bearing in the PS plate processor of the present embodiment.
Figure 28:
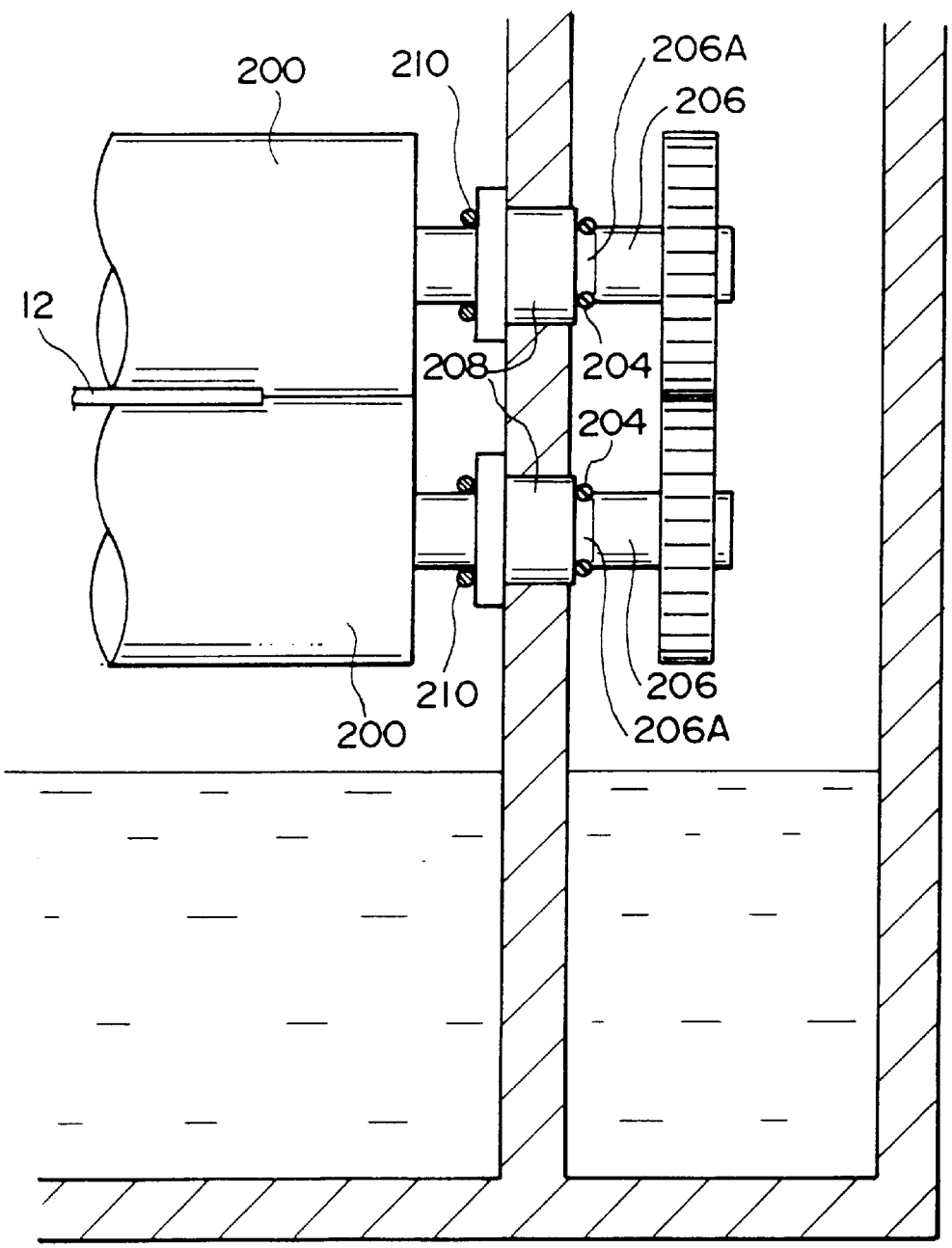
FIG. 28 is a front view of the main portions of another structure for preventing the shaft from falling out of the bearing in the PS plate processor of the present embodiment.

For this reason, in the present example, as is shown in FIG. 27, an elastic O ring 204 is mounted onto the rotating shaft 206 instead of an E ring so that the rotating shaft 206, which has a step portion 206B, is prevented from falling out of the bearing 208. The O ring 204 does not require a device and can be forced from the end of the shaft using only a finger against the elasticity, thereby reducing the man-hours in the production and assembly processes.

Figure 8:
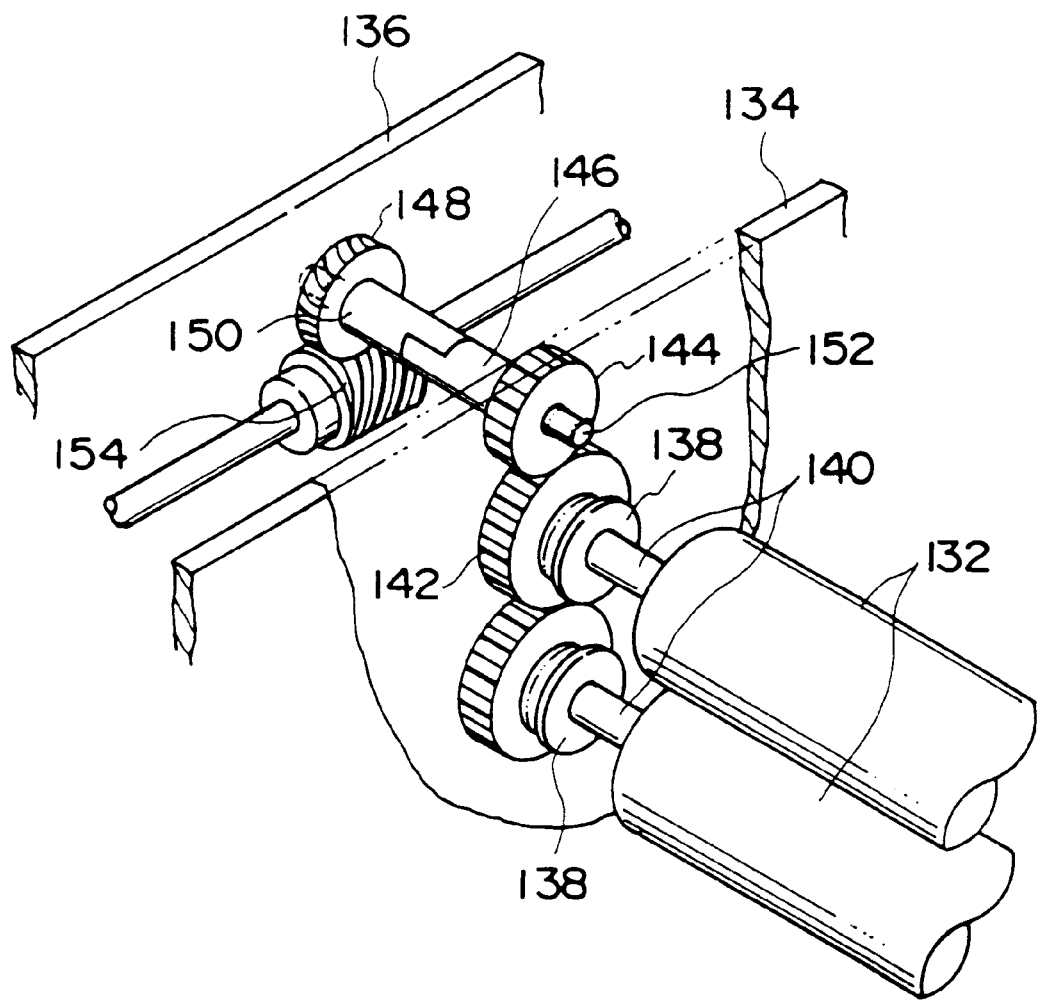
FIG. 8 is a perspective view showing another coupling structure used in the gear section of the PS plate processor of the present embodiment.
Figure 9:
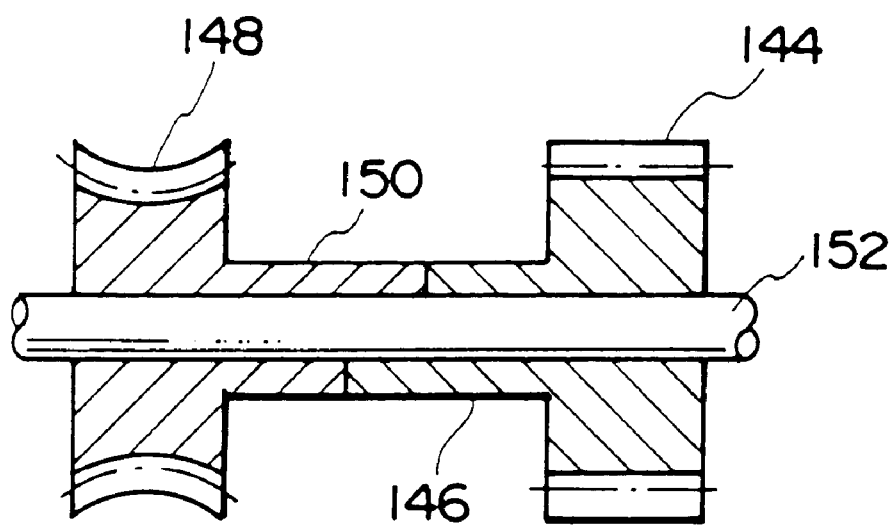
FIG. 9 is a cross-sectional view showing the main portions of the other coupling structure used in the gear section of the PS plate processor of the present embodiment.

Moreover, as is shown in FIG. 8, annular grooves 206A may be formed in the rotating shafts 206 and the elastic O rings 204 mounted thereto. Additional elastic O rings 210 may be mounted onto the roller sides. Either O ring not only provides a solution blocking effect, but also fixes the position of the rollers 200. More specifically, when the processing solution supplied to the PS plate 12 is squeezed off by the roller 200, the O rings are able to prevent the squeezed off processing solution from spreading along the rotating shafts 206, seeping into the bearings 208, and causing abrasion. In addition, the rollers 200 can be positioned on the bearings 208 by the O rings 204 and 210 mounted onto the annular grooves 206A.

By using O rings of different colors for each of the portions of the developing section, washing section, finisher section, and the like where an O ring is mounted, which roller with an O ring fitted thereto is used in which processing section can be immediately determined. Thus using the wrong roller in a particular section is prevented and each roller can be positioned in its proper processing section.

The structure for opening and closing the shutters will now be described. As is shown in FIG. 1, the transporting path aperture 66 connecting the drying section 16 and the finisher section 26 is opened and closed by a shutter 64. The shutter 64 is only opened when a PS plate 12 passes through thereby cutting off the flow of air between the inside and the outside of the processing portions of the developing section 18, the washing section 24, and the finisher section 26. Deterioration of the developing solution caused by carbon dioxide and evaporation of the water in the developing solution, the washing water, and the gum solution are thus prevented. Moreover, warm air from the drying section 66 is prevented from flowing through the transporting path aperture 66 into the finisher section 26, and thus components in the finisher solution are prevented from depositing onto the squeezing rollers 60.

Figure 29:
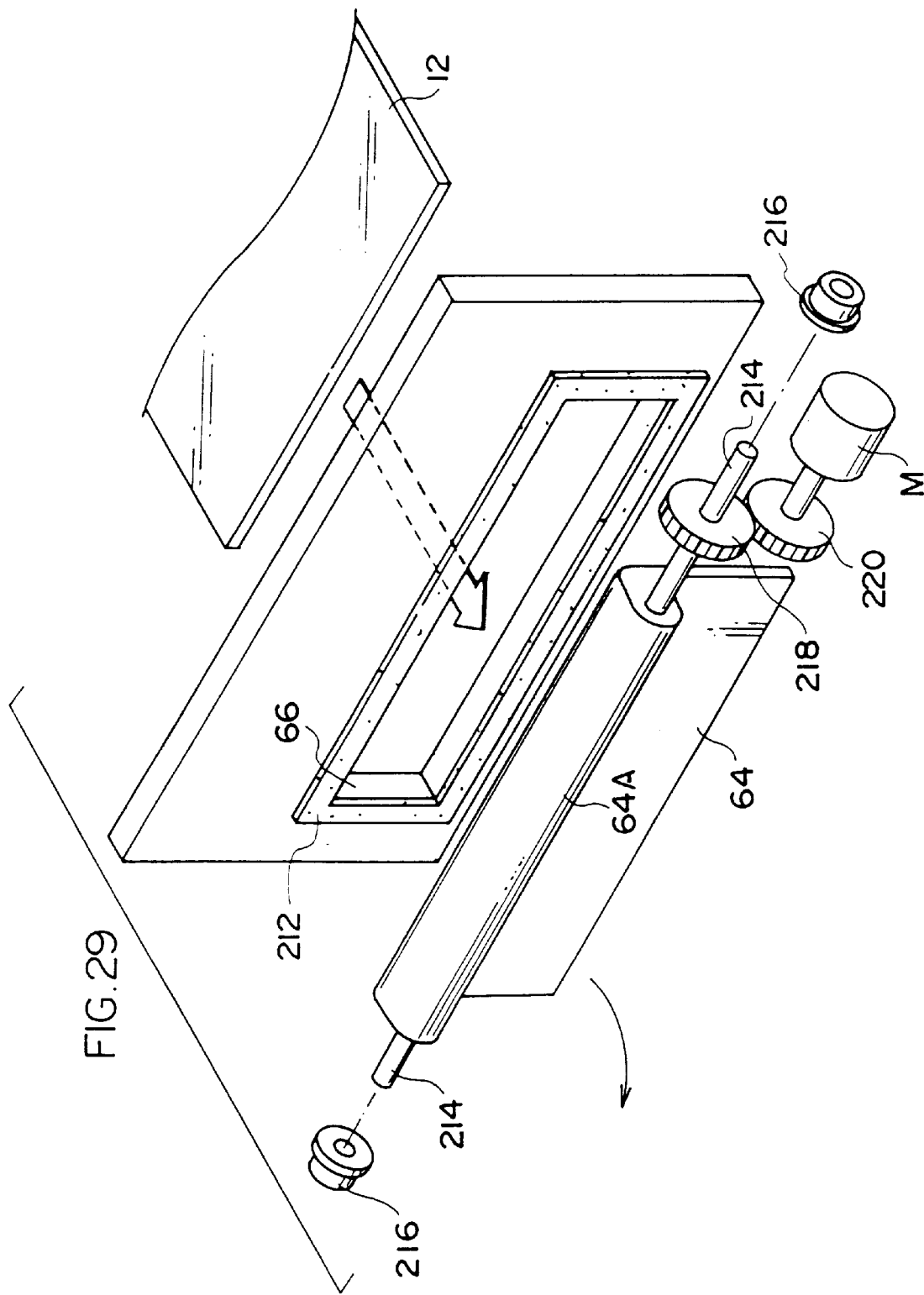
FIG. 29 is an exploded perspective view showing a shutter opening and closing mechanism of the PS plate processor of the present embodiment.

For this reason, as is shown in FIG. 29, packing 212 is adhered to the periphery of the transporting path aperture 66 and the aperture 66 is closed by a long plate-shaped shutter 64, thus cutting off the flow of air. A shaft 214 protrudes in the longitudinal direction from the base portion 64A of the shutter 64.

The ends of this shaft 214 are supported via bearings 216 by the side plates of the drying section 16. A transmission gear 218 is fixed to one end of the shaft 214. This transmission gear 218 meshes with a driving gear 220 attached to the rotating shaft of a motor M.

Accordingly, by controlling the direction of rotation of the motor M the shutter 64 is swung around the shaft 214 and the transporting path aperture can be opened and closed.

Figure 30:
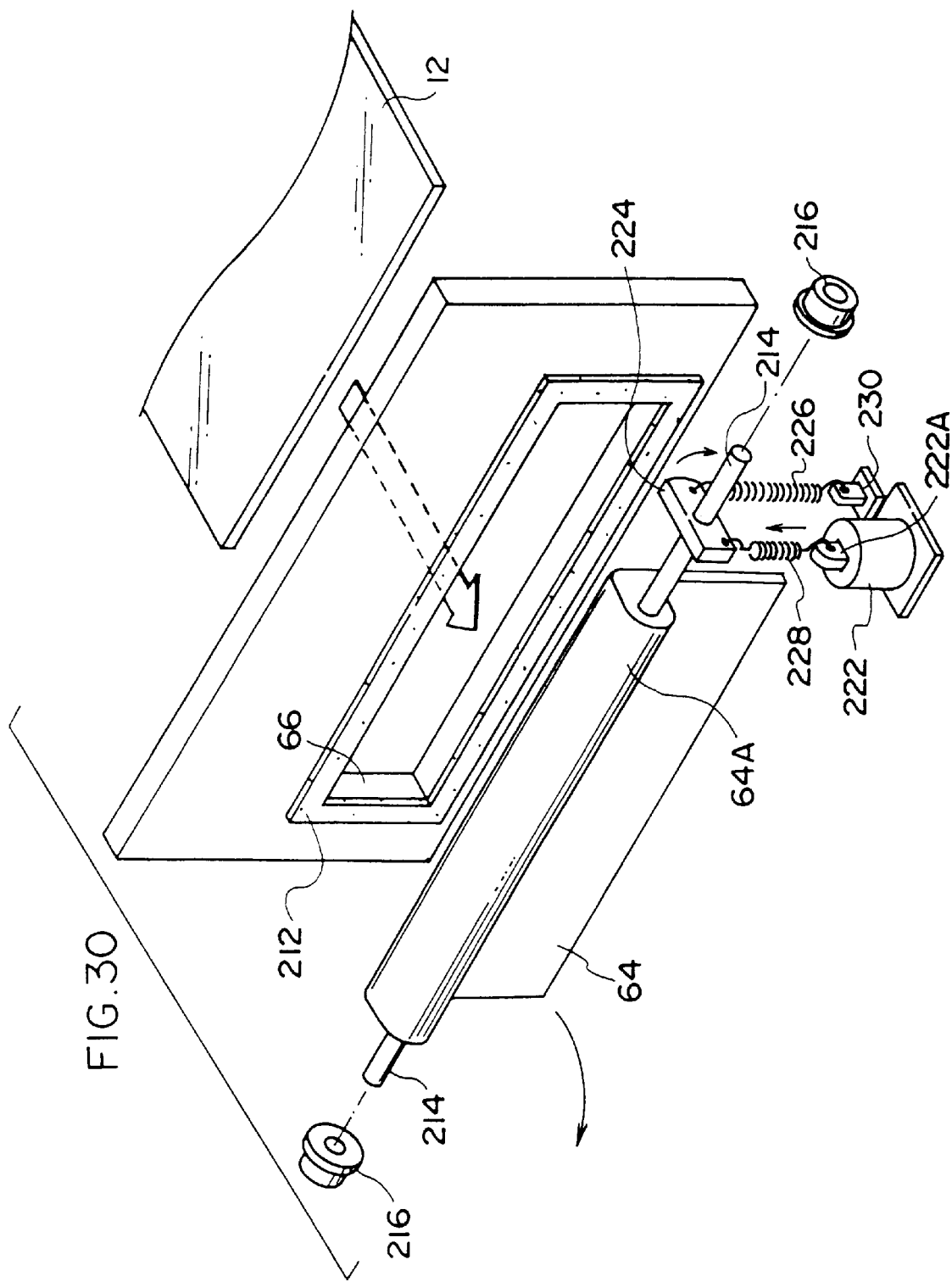
FIG. 30 is an exploded perspective view showing another shutter opening and closing mechanism of the PS plate processor of the present embodiment.

Alternatively, as is shown in FIG. 30, the shutter 64 may be swung using a solenoid 222 instead of the gear mechanism. Namely, the central part of an arm 224 is fixed to the shaft 214 and one end of the arm 222 is urged downwards by a spring 228 linked to the plunger 222A of the solenoid 222. Likewise, the other end of the arm 224 is urged downwards by a spring 226 linked to a bracket 230 so that balance of the arm is maintained.

Accordingly, when the plunger 222A is pushed out, the arm 224 rotates in a clockwise direction swinging the shutters 64 and opening the transporting path aperture 66.

Figure 31:
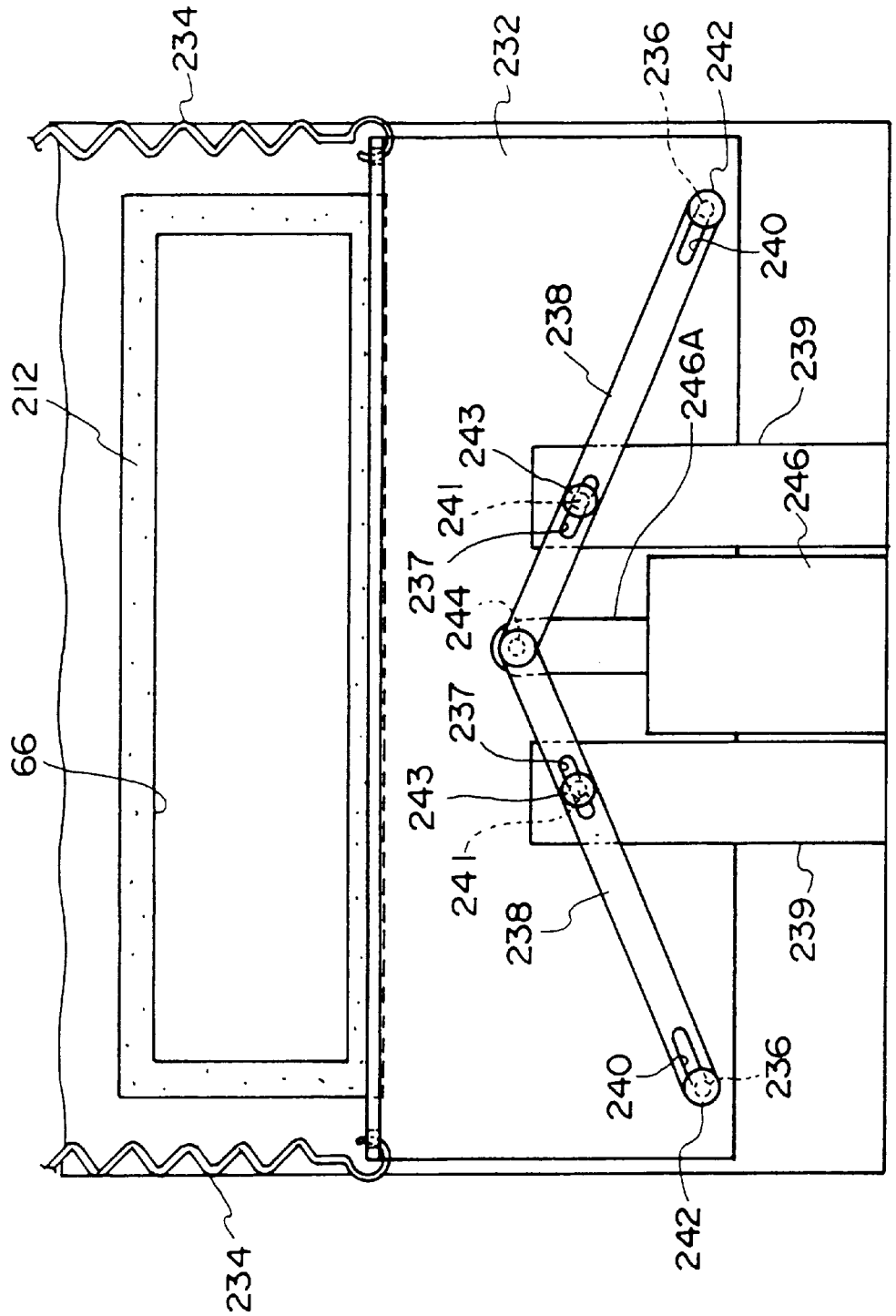
FIG. 31 is a front view showing a further shutter opening and closing mechanism of the PS plate processor of the present embodiment.
Figure 32:
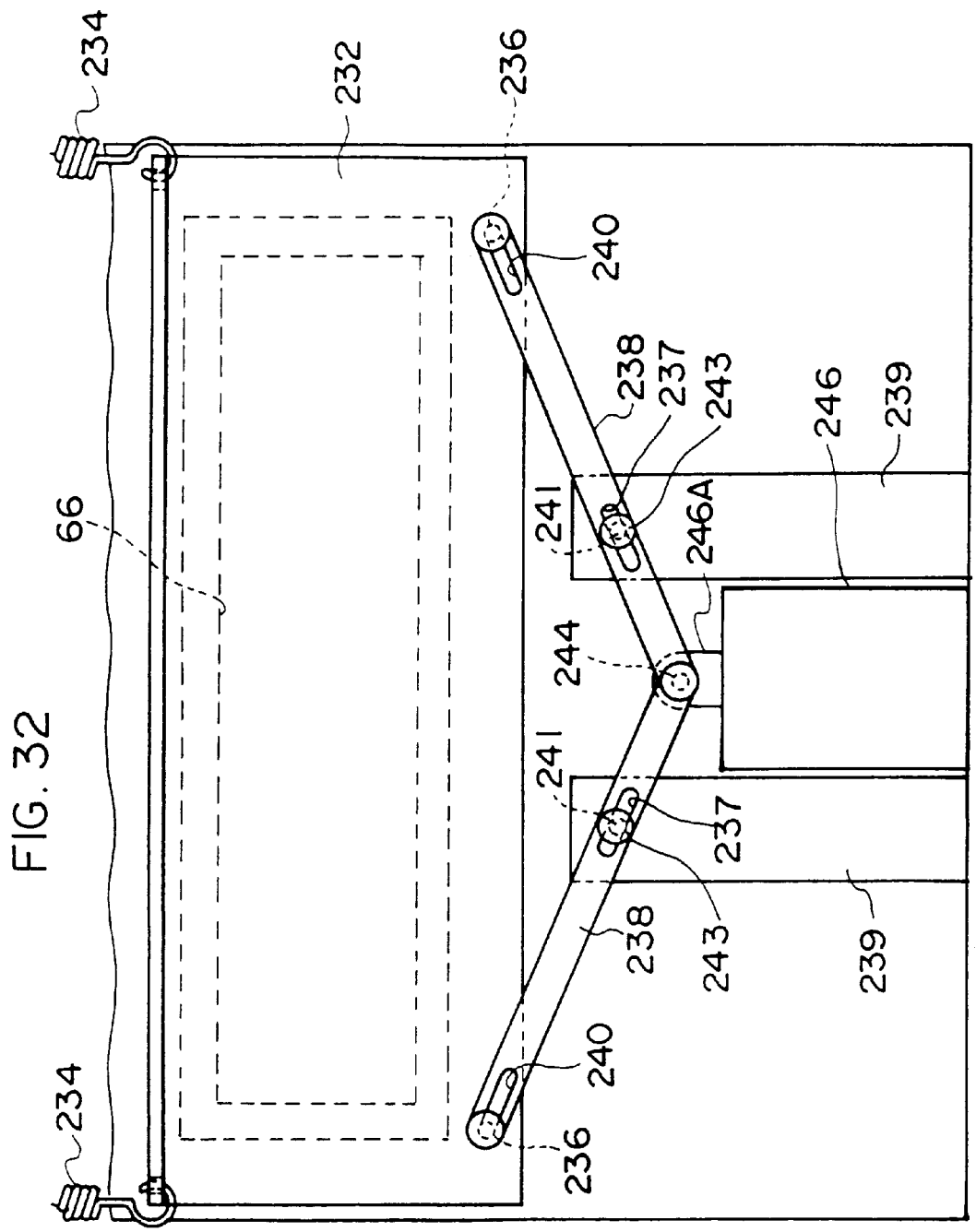
FIG. 32 is a front view showing the further shutter opening and closing mechanism of the PS plate processor of the present embodiment.

A structure for opening and closing the shutter using a link mechanism is shown in FIGS. 31 and 32.

In this example, both ends of the top portion of the shutter 232 are suspended by springs 234 so that the transporting path aperture 66 can be opened or closed by vertically raising or lowering the shutter 232. Protruding raising/lowering pins 236 are provided at the corners at the bottom of the shutter 232.

The raising/lowering pins 236 are inserted through elongated holes 240 formed in the end portions of two linking members 238 in such a manner that the raising/lowering pins 236 can slide backwards and forwards in the elongated holes 240. Moreover, a holding plate 242 is attached to the head of the raising/lowering pin 236 so that the raising/lowering pin 236 remains in place in the elongated hole 240.

Both of the other ends of the two linking members 238 are connected together by a connecting pin 244 in such a manner that the two linking members 238 can rotate around the connecting pin 244. The connecting pin 244 is connected to a plunger 246A of a solenoid 246 disposed beneath the transporting path aperture 66.

In addition, elongated holes 237 are provided in approximately the center of each of the two linking members 238. Axle pins 241, protruding from the elevated surface of brackets 239, are inserted through the elongated holes 237, and the linking members 238 are rotated around the fulcrum provided by the axle pins 241. Moreover, a holding plate 243 is attached to the head of each axle pin 241 so that the axle pin 241 remains in place in the elongated hole 237.

In the above-described structure, as is shown in FIG. 31, when the plunger 246A is pushed upwards thus raising the connecting pin 244, the two linking members 238 rotate around the fulcra provided by the axle pins 241 so as to form an inverted V shape. This rotation causes the walls of the elongated holes 240 to push down the raising/lowering pin 236 against the urging force provided by the spring 234 thereby lowering the shutter 232. The transporting path aperture 66 is thereby opened enabling the PS plate 12 to pass through.

Moreover, as is shown in FIG. 32, when the plunger 246A is drawn back in lowering the connecting pin 244, the two linking members 238 rotate around the fulcra provided by the axle pins 241 so as to form a V shape. This rotation causes the walls of the elongated holes 240 to push up the raising/lowering pin 236 using the urging force provided by the spring 234 thereby raising the shutter 232. The transporting aperture 66 is thereby closed, there is no air flow from the processing section to the drying section, and the dry air of the drying section does not flow into the finisher section.

Figure 33:
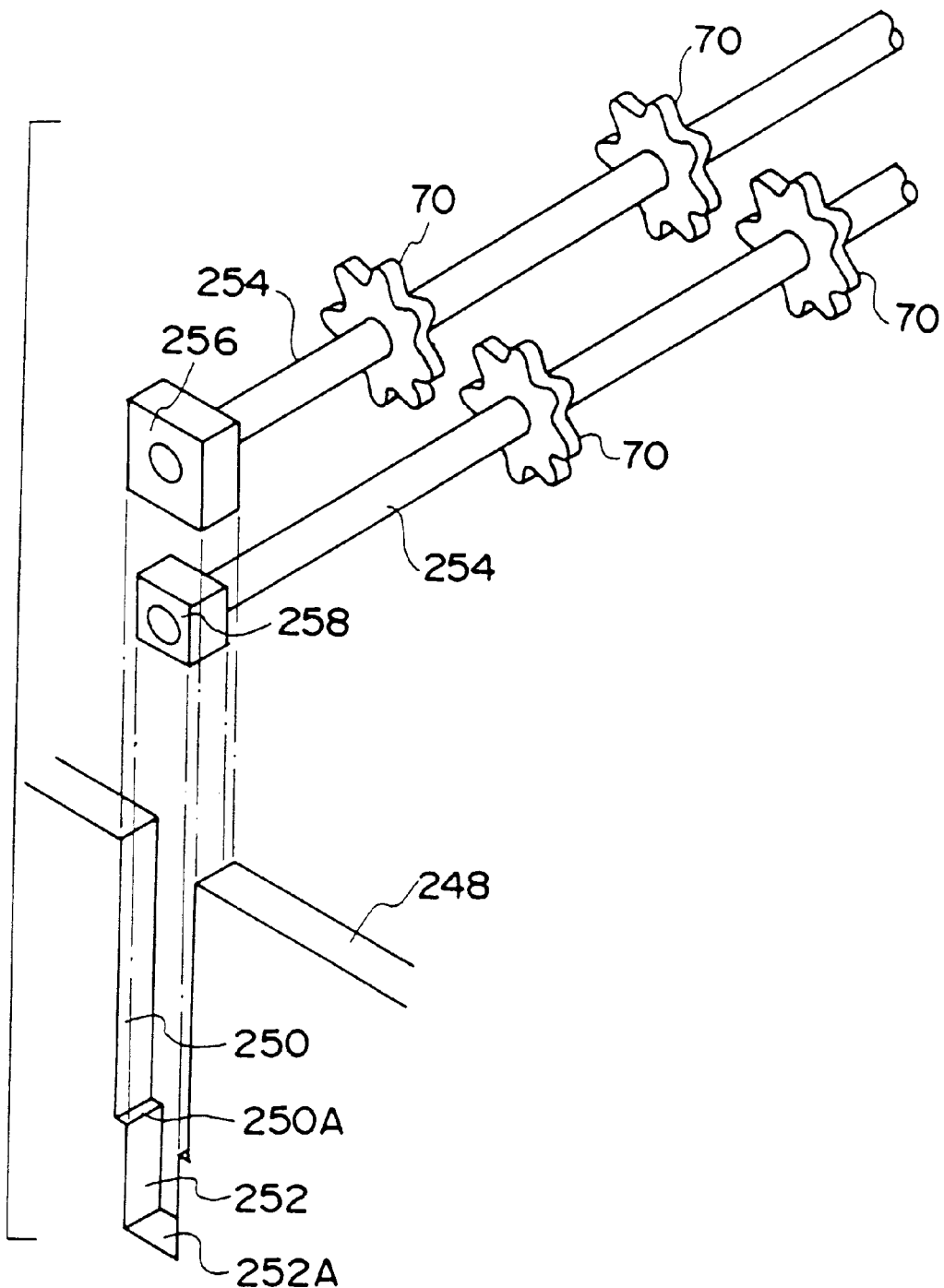
FIG. 33 is an exploded perspective view of a bearing structure for a starshaped roller of the PS plate processor of the present embodiment.

The structure of the bearings for the rollers will now be explained. Star-shaped rollers, as shown in FIG. 33, are used for the transporting rollers 70 disposed in the drying section 16 shown in FIG. 1. The area of the roller which contacts the PS plate 12 is made as small as possible thereby improving the drying performance and preventing the roller from sticking to the PS plate 12. Conventionally, spacers are inserted between the bearings in order to form a predetermined vertical interval between the star-shaped transporting rollers 70, however, in the present embodiment, a structure not using spacers has been employed in order to reduce the number of parts.

Namely, attachment grooves 250 and 252, having groove widths of different sizes, are formed in the side plates 248. The bearings 256 and 258 for supporting the ends of stays 254 are fitted into the attachment grooves 250 and 252.

The width of the bearing 256 is larger than the attachment groove 252 and is sized to fit into the attachment groove 250. On the other hand, the width of the bearing 258 is sized to pass easily through the attachment shaft 250 and fit into the attachment shaft 252.

Figure 34:
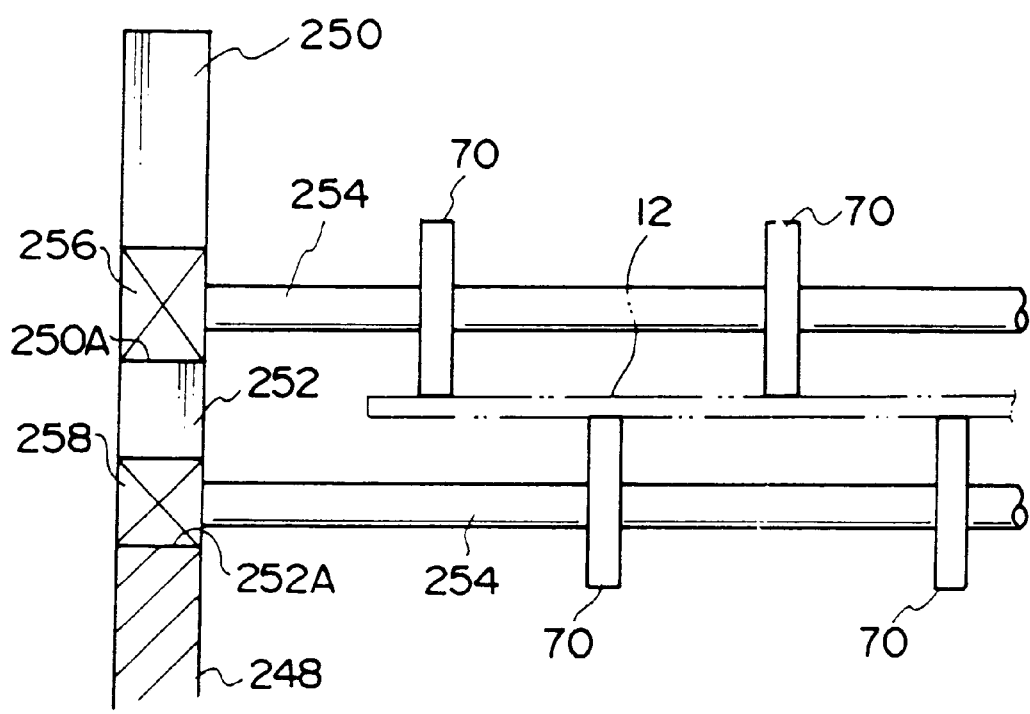
FIG. 34 is a cross-sectional view of a bearing structure for a star-shaped roller of the PS plate processor of the present embodiment.

Accordingly, as is shown in FIG. 34, the bearing 256 rests on the stepped portion 250A and the bearing 258 rests on the groove bottom 252A, thus providing a vertically predetermined interval between the transporting rollers 70.

Figure 35:
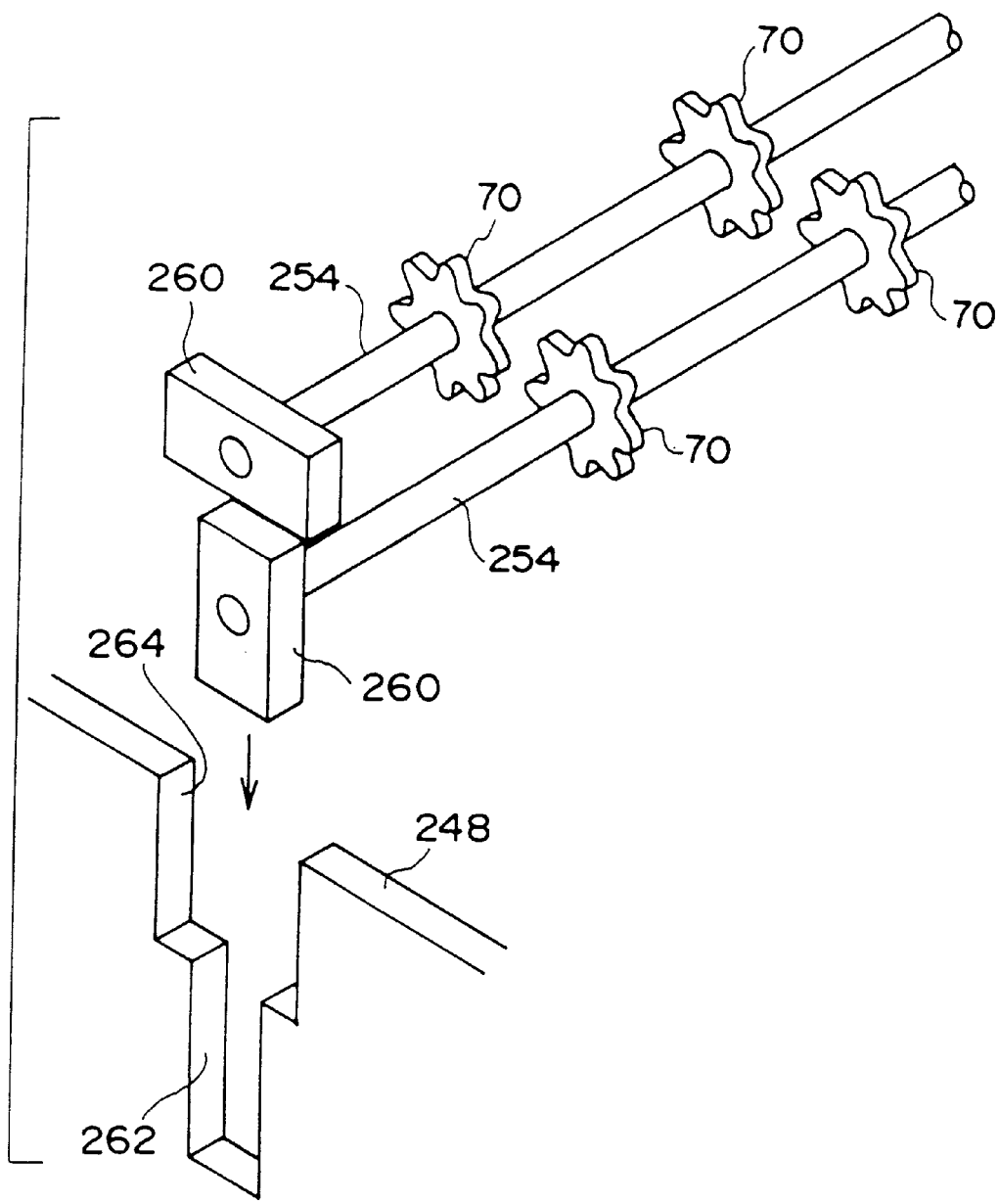
FIG. 35 is an exploded perspective view showing another bearing structure for a star-shaped roller of the PS plate processor of the present embodiment.

It should be noted that the interval between the pair of transporting rollers 70 can be adjusted by changing the shape of the attaching grooves and the size of the bearings. However, as is shown in FIG. 35, by using rectangular shaped bearings and disposing one bearing vertically and the other horizontally, and by forming attachment grooves 262 and 264 in the side plate 248 corresponding to these bearings, a predetermined interval between the transporting rollers 70 can be formed using a single type of bearing. Accordingly, the number of parts can be reduced and the number of production and assembly steps can also be reduced.

The present invention has employed the above-described structure to increase the airtightness of the seal in the processing section and to cut off the flow of air. This has allowed the deterioration of the processing solution caused by carbon dioxide to be minimized. In addition, evaporation of the water in the processing solution is controlled allowing the rate of replenishment of the processing solution to be reduced and contact between the shielding cover and the transported photosensitive material can be avoided.

What is claimed is:

1. A sealing structure for a processing section of a photosensitive material processing apparatus comprising a processing tank containing processing solution for processsing a photosensitive material, transporting means provided in said processing tank for transporting said photosensitive material, a shielding cover provided iin said processing tank, and a top cover which covers said processing tank and contacts a top portion of said shielding cover, wherin said shielding cover has side walls which extend from a bottom wall of said shielding cover to contact said top cover.

2. A sealing structure for a processing section of a photosensitive material processing apparatus according to claim 1, wherein a roller for transporting said photosensitive material is provided at a bottom edge portion of a wall of the shielding cover on an upstream side in a transporting direction of the photosensitive material extending in a direction intersecting the transporting direction of the photosensitive material.

3. A sealing structure for a processing section of a photosensitive material processing apparatus according to claim 2, wherein said shielding cover is constructed as a hollow box.

4. A sealing structure for a processing section of a photosensitive material processing apparatus comprising a processing tank containing processing solution for processing a photosensitive material, transporting means provided in said processing tank for transporting said photosensitive material, a shielding cover provided in said processing tank, and a top cover which covers said processing tank and contacts a top portion of said shielding cover, wherein an engaging portion is formed in a rear surface of said top cover to engage with an upper portion of said shielding cover.

5. A sealing structure for a processing section of a photosensitive material processing apparatus according to claim 4, wherein said transporting means is separated by a side plate formed integrally with the processing tank into a transporting system for transporting said photosensitive material and a driving system for driving said transporting system, wherein said driving system is sealed by a lid portion, which covers a top of said driving system, extending from said side plate.

6. A sealing structure for a processing section of a photosensitive material processing apparatus according to claim 4, wherein a roller for transporting said photosensitive material is provided at a bottom edge portion of a wall of the shielding cover on an upstream side in a transporting direction of the photosensitive material extending in a direction intersecting the transporting direction of the photosensitive material.

7. A sealing structure for a processing section of a photosensitive material processing apparatus according to claim 4, wherein said shielding cover is constructed as a hollow box.

8. A sealing structure for a processing section of a photosensitive material processing apparatus comprising a processing tank containing processing solution for processing a photosensitive material, transporting means provided in said processing tank for transporting said photosensitive material, a shielding cover provided in said processing tank, and a top cover which covers said processing tank and contacts a top portion of said shielding cover, wherein said transporting means is separated by a side plate formed integrally with the processing tank into a transporting system for transporting said photosensitive material and a driving system for driving said transporting system, wherein said driving system is sealed by a lid portion, which covers a top of said driving system, extending from said side plate.

9. A sealing structure for a processing section of a photosensitive material processing apparatus according to claim 8, wherein a roller for transporting said photosensitive material is provided at a bottom edge portion of a wall of the shielding cover on an upstream side in a transporting direction of the photosensitive material extending in a direction intersecting the transporting direction of the photosensitive material.

10. A sealing structure for a processing section of a photosensitive material processing apparatus according to claim 8, wherein said shield cover is constructed as a hollow box.

11. A sealing structure for a processing section of a photosensitive material processing apparatus according to claim 8, wherein said processing solution in said processing tank is replenished with replenishing solution so that a level of a surface of said processing solution in said processing tank is always above a bottom wall of the shielding cover.

12. A sealing structure for a processing section of a photosensitive material processing apparatus comprising a processing tank containing processing solution for processing a photosensitive materials transporting means provided in said processing tank for transporting said photosensitive material, a shielding cover provided in said processing tank, and a top cover which covers said processing tank and contacts a top portion of said shielding cover, wherein said shielding cover is constructed as a hollow box.

13. A sealing structure for a processing section of a photosensitive material processing apparatus according to claim 12, wherein said processing solution in said processing tank is replenished with replenishing solution so that a level of a surface of said processing solution in said processing tank is always above a bottom wall of the shielding cover.

14. A sealing structure for a processing section of a photosensitive material processing apparatus according to claim 13, wherein a central portion of a bottom of said photosensitive material developing tank is shaped with a wide V-shape protruding downwards and said photosensitive material is transported parallel to the bottom of said processing tank.

15. A sealing structure for processing section of a photosensitive material processing apparatus according to claim 13, wherein said photosensitive material is a lithographic presensitezed printing plate.

16. A sealing structure for a processing section of a photosensitive material processing apparatus according to claim 14, wherein said photosensitive material is lithographic presensitize printing plate.

17. A sealing structure for a processing section of a photosensitive material processing apparatus according to claim 12, wherein a central portion of a bottom of said photosensitive material processing tank is shaped with a wide V-shape protruding downwards and said photosensitive material is transported parallel to the bottom surface of said processing tank.

18. A sealing structure for a processing section of a photosensitive material processing apparatus comprising a processing tank containing processing solution for processing a photosensitive material, transporting means provided in said processing tank for transporting said photosensitive material, a shielding cover provided in said processing tank, and a top cover which covers said processing tank and contacts a top portion of said shiking cover, wherein said processing solutio in said processing tank is repleished with replenishing solution so that a level of a surface of said processing solution in said processing tank is always above a bottom wall of the shielding cover.

19. A sealing structure for a processing section of a photosensitive material processing apparatus comprising a processing tank containing processing solution for processing a photosensitive material, transporting means provided in said processing tank for transporting said photosensitive material, a shielding cover provided in said processing tank, and a top cover which covers said processing tank and contacts a top portion of said shielding cover, wherein a roller for transporting said photosensitive material is provided at the bottom edge portion of the wall of the shielding cover on the upstream side in the transporting direction of the photosensitive material extending in a direction intersecting the transporting direction of the photosensitive material, wherein said processing solution in said processing tank is replenished with replenishing solution so that a level of a surface of said processing solution in said processing tank is always above a bottom wall of the shielding cover.

20. A sealing structure for a processing section of a photosensitive material processing apparatus comprising a processing tank containing processing solution for processing a photosensitive material, transporting means provided in said processing tank for transporting said photosensitive material, a shielding cover provided in said processing tank, and a top cover which covers said processing tank and contacts a top portion of said shielding cover, wherein a roller for transporting said photosensitive material is provided at the bottom edge portion of the wall of the shielding cover on the upstream side in the transporting direction of the photosensitive material extending in a direction intersecting the transporting direction of the photosensitive material, wherein a central portion of a bottom of said photosensitive material processing tank is shaped with a wide V-shape protruding downwards and said photosensitive material is transported parallel to the bottom surface of said processing tank.

21. A photosensitive material processing apparatus for processing a lithographic presensitized printing plate comprising a developing section, a washing section, and a finishing section, wherein said developing section is sealed by a shielding cover, a top cover, side walls, and a plurality of combinations of transporting rollers and blades, wherein said top cover has an engaging portion on a rear side thereof to engage said top cover with an upper portion of said shielding cover, and a level of the surface of processing solution in a processing tank is always above a bottom wall of said shielding cover.

22. A photosensitive material processing apparatus for processing a lithographic presensitized printing plate according to claim 21, wherein an exit of said finishing section has a shutter for increasing an air tightness of said washing section and said finishing section.

23. A photosensitive material processing apparatus for processing a lithographic presensitized printing plate according to claim 22, wherein said developing section has a pair of transporting rollers and a pair of blades in a vicinity of an insertion aperture for inserting a PS plate.

* * * * *